(12) United States Patent
Luz et al.

(10) Patent No.: US 6,661,284 B1
(45) Date of Patent: Dec. 9, 2003

(54) METHOD AND APPARATUS FOR ERROR COMPENSATION IN A HYBRID MATRIX AMPLIFICATION SYSTEM

(75) Inventors: Yuda Luz, Buffalo Grove, IL (US); Jiangnan Jason Chen, Hawthorne Woods, IL (US); Philip Zhou, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 17 days.

(21) Appl. No.: 10/145,909

(22) Filed: May 15, 2002

(51) Int. Cl.[7] ................................................ H03F 3/68
(52) U.S. Cl. ..................... 330/124 R; 330/53; 330/149; 330/295; 455/126
(58) Field of Search .................... 330/53, 84, 124 R, 330/149, 295, 286, 124 D, 147, 148; 455/126

(56) References Cited

U.S. PATENT DOCUMENTS 5,764,104 A * 6/1998 Luz .......................... 330/124 R
5,834,972 A * 11/1998 Schiemenz, Jr. et al. ... 330/124 R
6,421,528 B1 * 7/2002 Rosen et al. ............... 455/67.6

* cited by examiner

Primary Examiner—Henry Choe
(74) Attorney, Agent, or Firm—Steven A. May

(57) ABSTRACT

A base station subsystem includes at least one transmit branch having a forward path that includes a signal processing unit coupled at an input to an input Fourier Transform Matrix (FTM) and at an output to an output FTM. The transmit branch further includes two error compensation loops, an inner feedback loop and an outer feedback loop. The inner feedback loop provides error compensation for error introduced by the signal processing section to a signal input to the transmit branch. The outer loop provides error compensation for all residual error introduced into the signal when routed through the transmit branch forward path after error compensation may be performed by the inner feedback loop.

21 Claims, 8 Drawing Sheets

METHOD AND APPARATUS FOR ERROR COMPENSATION IN A HYBRID MATRIX AMPLIFICATION SYSTEM

FIELD OF THE INVENTION

The present invention relates generally to wireless communication devices, and in particular to a hybrid matrix amplification system and an antenna array of a wireless communication device.

BACKGROUND OF THE INVENTION

A hybrid matrix amplifier comprises a parallel set of amplifiers whose inputs are fed, and output are combined, by multi-port matrices, made up of hybrid couplers. An exemplary configuration of a hybrid matrix amplifier wherein the matrices are Fourier Transform Matrices (FTMs) is described in U.S. patent application Ser. No. 5,834,972, which patent is assigned to the assignee of the present invention and is hereby incorporated by reference herein in its entirety. In general, a signal applied to an input port of an input FTM is distributed equally among multiple output ports of the FTM. Each signal output by the FTM is then routed to a separate amplifier, where the signal is amplified and then routed to one of multiple input ports of an output FTM. Each signal received at an input port of the output FTM is then distributed among multiple output ports of the output FTM.

Use of a transmitter that includes a hybrid matrix amplifier has been proposed for a base station subsystem (BSS) that service multiple cell sectors and that include multiple adaptive antenna arrays, wherein each antenna array of the multiple antenna arrays provides service to a different sector of the multiple cell sectors. In such a BSS, each signal produced at one of the multiple output ports of an output FTM is routed to an antenna element in an antenna array. Furthermore, each antenna element receiving an FTM output signal is in a different antenna array than the other antenna elements receiving output signals from the FTM.

For example, suppose a BSS services a cell that is divided into four sectors. The BSS includes four antenna arrays, wherein each array includes four antenna elements and services one of the four cell sectors. The BSS further includes four transmit branches. Each transmit branch includes an input FTM having four input and four output ports, an output FTM having four input and four output ports, and an amplifier section comprising four amplifiers, wherein each amplifier of the four amplifiers is operably coupled to an output port of the input FTM and to an input port of the output FTM. Furthermore, each output port of a transmit branch's output FTM is operably coupled to an antenna element in an antenna array different from the elements and arrays to which the other FTM output ports are coupled. That is, a first output port of the FTM is operably coupled to an element in a first antenna array of the four antenna arrays, a second output port is operably coupled to an element in a second array of the four arrays, a third output port is operably coupled to an element in a third array of the four arrays, and a fourth output port is operably coupled to an element in a fourth array of the four arrays. As a result, each transmit branch is operably coupled to an antenna element in each of the antenna arrays.

Due to variations in length of transmit branch connecting cables, component aging, and variations in component performance, a gain and phase of signals propagating through a transmit branch may vary slowly with time. When each of multiple signals input into a transmit branch and output to a different antenna element than other input signals experiences a different gain and phase than the other input signals, there exists a possibility of cross-sector signal leakage. Cross-sector signal leakage results in a signal intended for transmission in one cell sector interfering with a signal transmitted in another cell sector. Furthermore, when a gain and phase of a signal propagation path through a transmit branch and a coupled antenna element is unknown, uncalibrated, or subject to variation over time, there exists the possibility of improper beam formation when beam forming weights are applied to the elements of the array that includes the coupled element. Therefore a need exists for a method and apparatus of calibrating, or providing error compensation for, signal propagation paths of transmit branches that include hybrid matrix amplifiers, and particularly which calibration or error compensation can be determined without shutting down the BSS.

DESCRIPTION OF A PREFERRED EMBODIMENT

Figure 1:
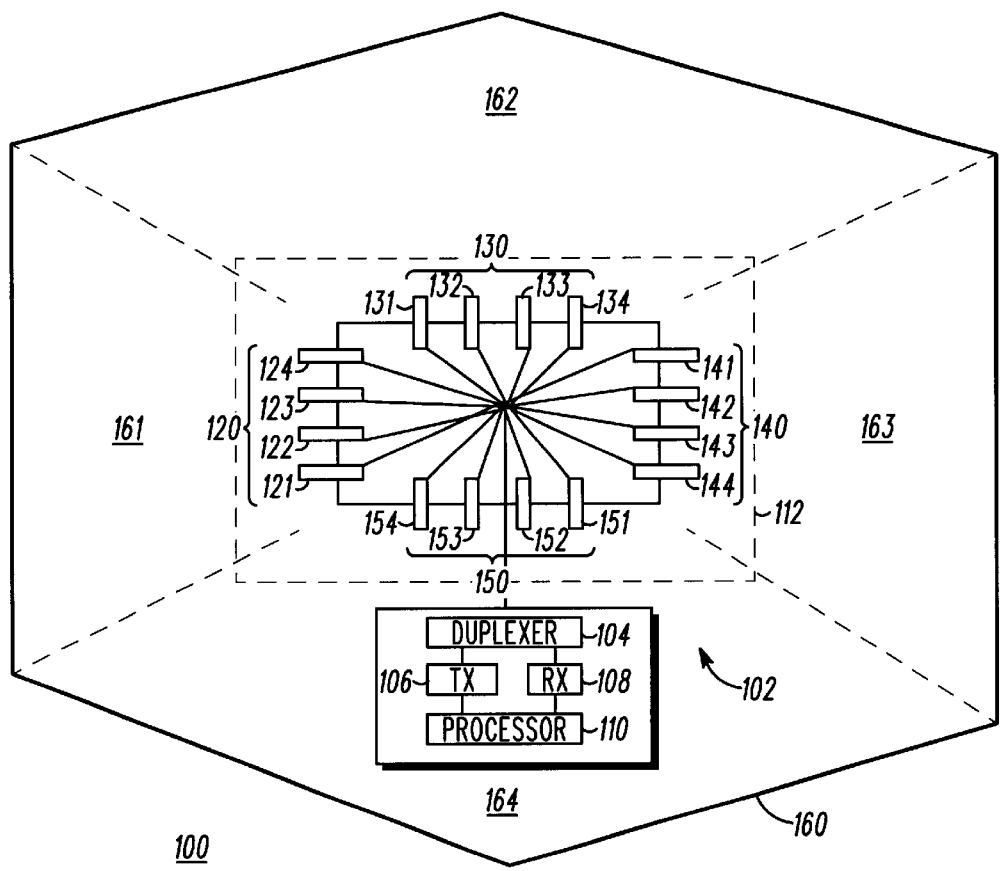
FIG. 1 is a block diagram of a wireless communication system in accordance with an embodiment of the present invention.

To address the need for a method and apparatus of calibrating, or providing error compensation for, signal propagation paths of transmit branches that include hybrid matrix amplifiers, which calibration or error compensation can be determined without shutting down the BSS, a base station subsystem includes at least one transmit branch having a forward path that includes a signal processing unit coupled at an input to an input Fourier Transform Matrix (FTM) and at an output to an output FTM. The transmit branch further includes two error compensation loops, an inner feedback loop and an outer feedback loop. The inner feedback loop provides error compensation for error introduced by the signal processing section to a signal input to the transmit branch. The outer loop provides error compensation for all residual error introduced into the signal when routed through the transmit branch forward path after error compensation may be performed by the inner feedback loop.

Generally, the present invention encompasses an apparatus for error compensation in a hybrid matrix amplification system. The apparatus includes an input signal forward path that comprises an input Fourier Transform Matrix (FTM) having multiple input ports and multiple output ports, a signal processing section, and an output FTM. The signal processing section has multiple input ports and multiple output ports, wherein each input port of the multiple signal processing section input ports is coupled to an output port of the multiple output ports of the input FTM. The output FTM having multiple input ports and multiple output ports, wherein each input port of the multiple input ports of the output FTM is coupled to an output port of the multiple signal processing section output ports. The apparatus further includes an outer loop feedback circuit coupled to the input signal forward path that samples a signal output by the input signal forward path to produce an attenuated output signal, determines an outer loop error based on the attenuated output signal, and produces an outer loop control signal based on the outer loop error. Based on the outer loop control signal, the input signal forward path adjusts at least one of a gain and a phase of a signal coupled to the input signal forward path.

Another embodiment of the present invention encompasses a multi-channel transmitter that includes an input signal forward path having multiple input ports and multiple output ports and an outer loop feedback circuit coupled to the input signal forward path. The input signal forward path further includes an input FTM, a signal processing section, and an output FTM. The input FTM has multiple input ports and multiple output ports and receives a predetermined signal at an input port of the multiple input ports and routes at least a portion of the predetermined signal to each output port of the multiple output ports to produce a plurality of input FTM output signals. The signal processing section has multiple input ports and multiple output ports, wherein each input port of the multiple input ports of the signal processing section receives an input FTM output signal of the multiple input FTM output signals. The signal processing section amplifies each received input FTM output signal to produce an amplified signal and routes each amplified signal to an output port of the plurality of signal processing section output ports. The output FTM has multiple input ports and multiple output ports, wherein each input port of the multiple input ports of the output FTM receives an amplified signal from an output port of the multiple output ports of the signal processing section, and wherein the output FTM produces a forward path output signal at an output port of the multiple output ports based on the multiple received amplified signals. The outer loop feedback circuit receives at least a portion of the forward path output signal, determines an outer loop error based on the at least a portion of the forward path output signal, and produces an outer loop control signal based on the outer loop error. The input signal forward path adjusts at least one of a gain and a phase of a signal coupled to the input signal forward path based on the outer loop control signal.

Yet another embodiment of the present invention provides a method of error compensation in a hybrid matrix amplification system. The method comprises steps of coupling a predetermined signal to a first Fourier Transform Matrix (FTM) to produce multiple first FTM output signals and processing each first FTM output signal of the multiple first FTM output signals to produce multiple amplified signals. The method further includes steps of coupling each amplified signal of the multiple amplified signals to an input port of multiple input ports of a second FTM, wherein the second FTM produces a second FTM output signal based on the multiple amplified signals and determining a loop error based on the second FTM output signal. The method further includes a step of producing a control signal based on the determined loop error, wherein the control signal is operable to adjust at least one of a gain and a phase of a signal coupled to the hybrid matrix amplification system.

The present invention may be more fully described with reference to FIGS. 1–10. FIG. 1 is a block diagram of a wireless communication system 100 in accordance with an embodiment of the present invention. Communication system 100 comprises a fixed wireless communication device, preferably a base station subsystem (BSS), 102 that provides communications service to a service coverage area, or cell, 160. Cell 160 is divided into multiple geographic sectors 161–164 (four shown). BSS 102 includes a duplexer section 104 that is coupled to each of a multi-channel transmitter 106 and a receiver 108 and is further coupled to an antenna 112. Multi-channel transmitter 106 and receiver 108 are each further coupled to a processor 110, such as one or more microprocessors, microcontrollers, digital signal processors (DSPs), combinations thereof or other such devices known to those having ordinary skill in the art. Antenna 112 is a directional antenna that is divided into multiple antenna sectors 120, 130, 140, 150 (four shown), wherein each sector of the multiple antenna sectors corresponds to, and provides communications service to, a respective geographic sector of the multiple geographic sectors 161–164.

Each antenna sector 120, 130, 140, 150 comprises an antenna array that includes multiple, preferably four (4), antenna elements. For example, antenna sector 120 includes antenna elements 121–124, antenna sector 130 includes antenna elements 131–134, antenna sector 140 includes antenna elements 141–144, and antenna sector 150 includes antenna elements 151–154. By utilizing an antenna array to broadcasting signals to a mobile station located in the cell sector serviced by the antenna array, BSS 102 is able to utilize one of numerous known beamforming methods for the broadcast of the signals.

Figure 2:
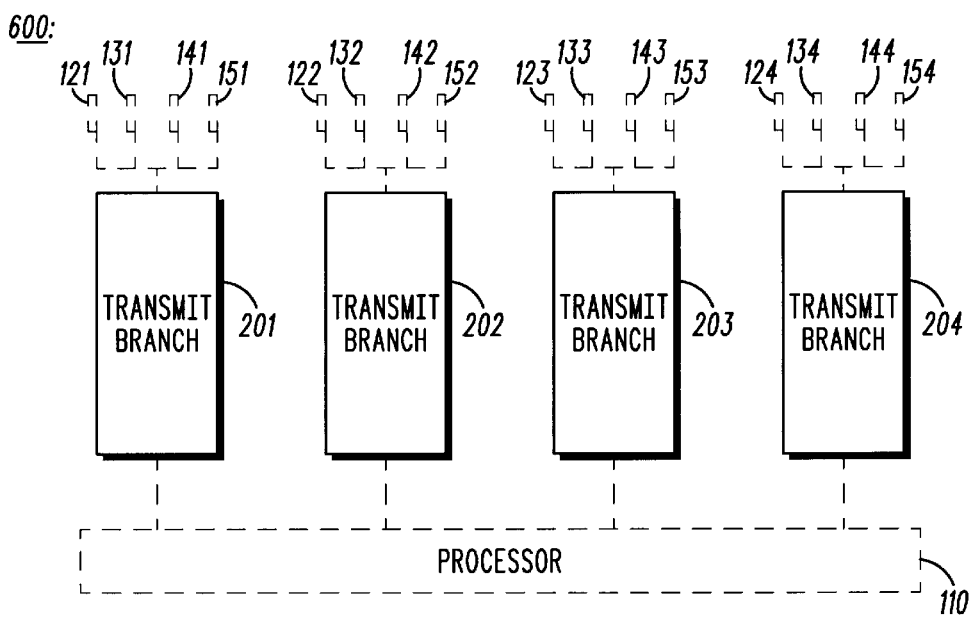
FIG. 2 is a block diagram of a transmitter section of a base station subsystem of FIG. 1 in accordance with an embodiment of the present invention.

FIG. 2 is a block diagram of multi-channel transmitter 106 of BSS 102 in accordance with an embodiment of the present invention. As depicted in FIG. 2, multi-channel transmitter 106 of BSS 102 includes four transmit branches 201–204; however, the number of transmit branches is up to the designer of BSS 102 as the present invention does not require four transmit branches. Preferably, each transmit branch 201–204 is operably coupled, via duplexer section 104 (not shown in FIG. 2), to an antenna element in each sector, or array, 120, 130, 140, 150 of antenna 112, so that the number of transmit branches corresponds to the number of antenna elements in each of antenna arrays 120, 130, 140, and 150. As a result, each transmit branch 201–204 services each of the multiple sectors 161–164 of cell 160 and therefore is shared among the cell's sectors. Each transmit branch 201–204 provides multiple paths through which radio frequency (RF) signals, or the RF signals' derivatives, propagate as the signals travel from processor 110 to the antenna elements coupled to the transmit branch.

Figure 3A:
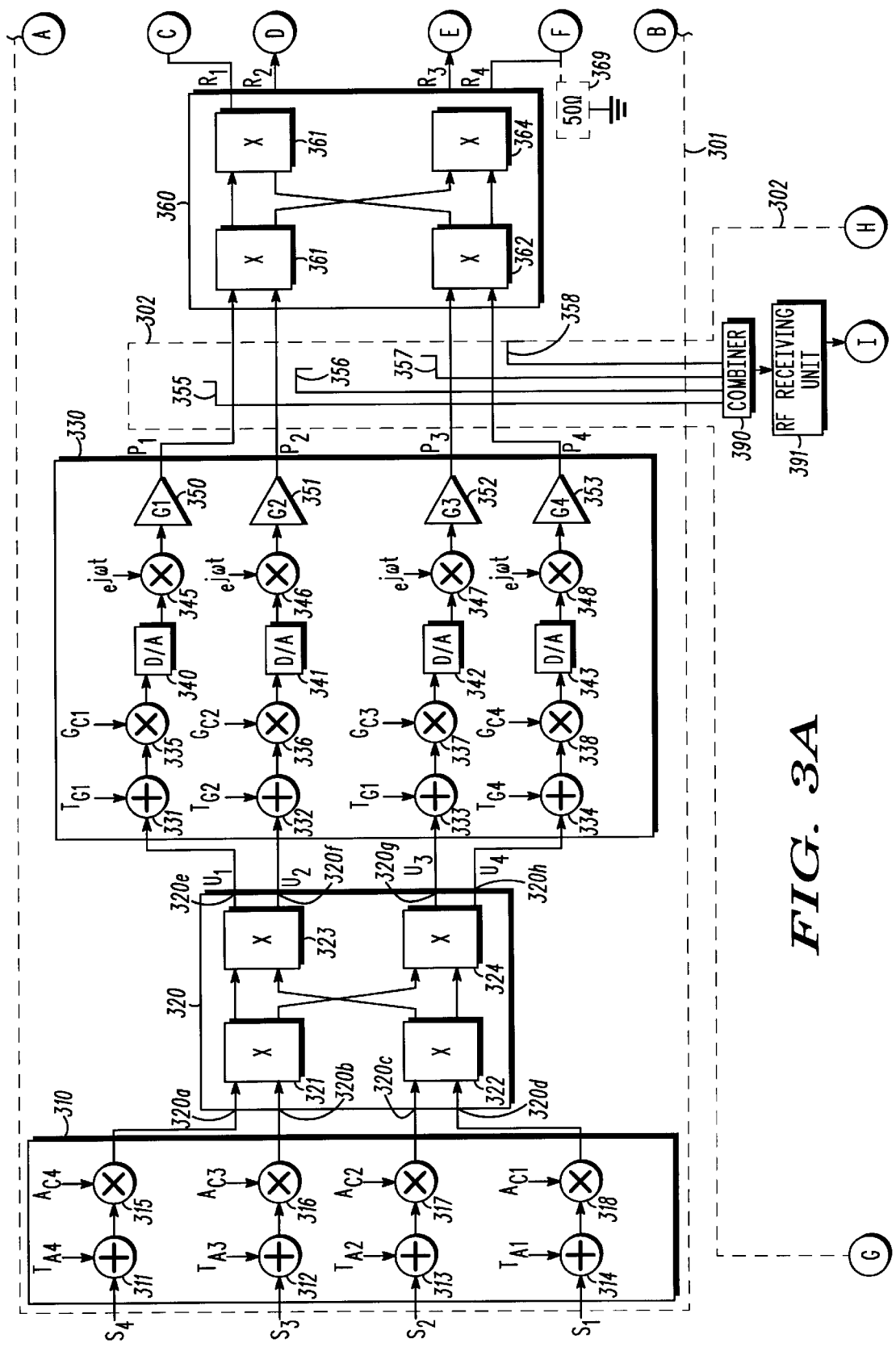
FIG. 3A is a block diagram of a transmit branch in accordance with an embodiment of the present invention.
Figure 3B:
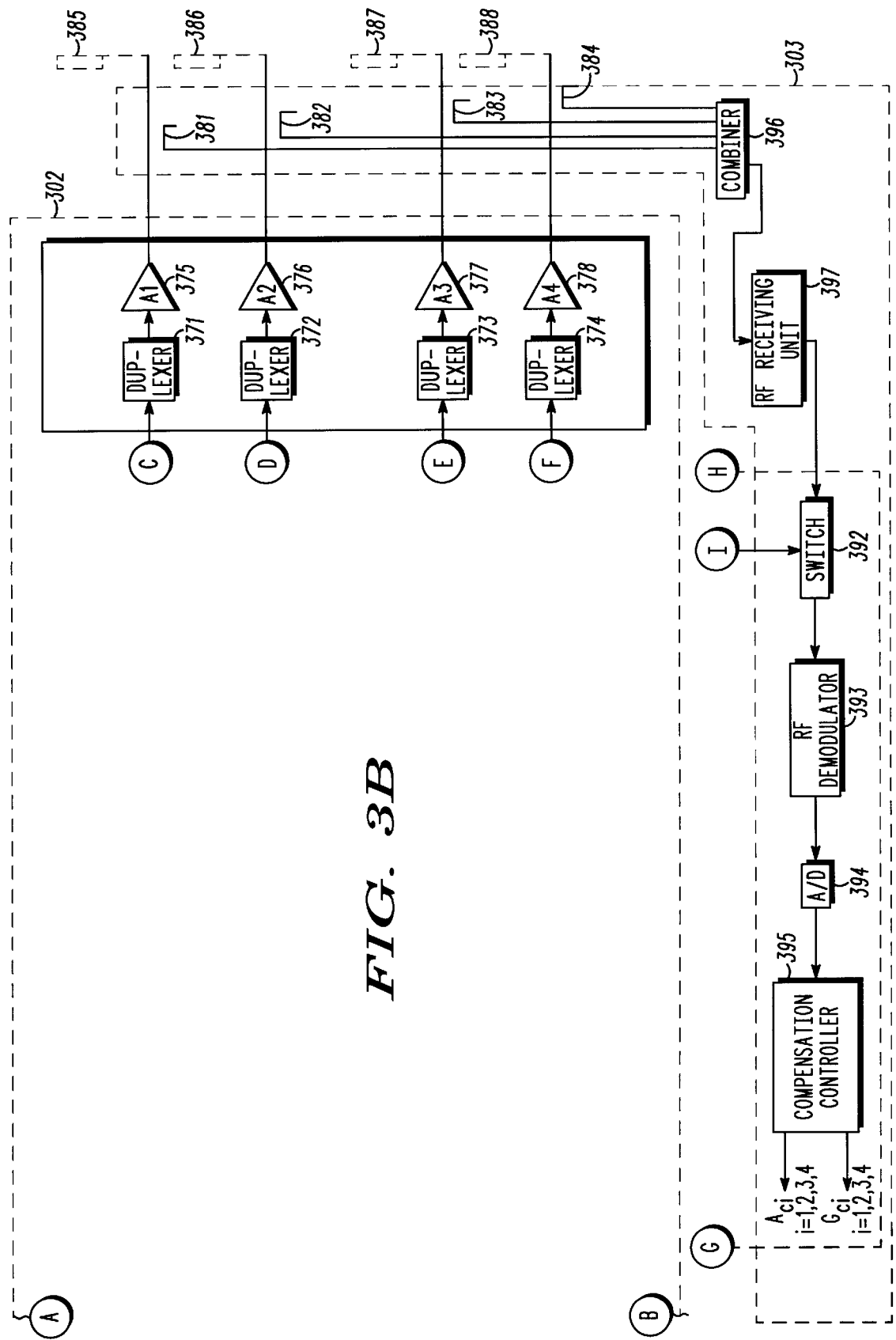
FIG. 3B is a continuation of the block diagram of FIG. 3A and is a block diagram of a transmit branch in accordance with an embodiment of the present invention.

Referring now to FIGS. 3A and 3B, a block diagram is provided of a transmit branch 300, such as transmit branches 201–204, in accordance with an embodiment of the present invention. Transmit branch 300 comprises a hybrid matrix amplification system that includes a transmit branch forward path 301 coupled to each of a first, inner loop feedback circuit 302 and a second, outer loop feedback circuit 303. Transmit branch 300 is operably coupled to each of multiple antenna elements 385–388, such as transmit branch 201 and associated antenna elements 121, 131, 141, and 151, transmit branch 202 and associated antenna elements 122, 132, 142, and 152, transmit branch 203 and associated antenna elements 123, 133, 143, and 153, and transmit branch 204 and associated antenna elements 124, 134, 144, and 154.

Transmit branch forward path 301 comprises an input circuit 310 coupled to a digital baseband Fourier Transform Matrix (FTM) 320, a signal processing section 330 coupled to baseband FTM 320, an RF FTM 360 coupled to signal processing section 330, and an output circuit 370 coupled to RF FTM matrix 360. Inner loop feedback circuit 302 comprises multiple inner loop signal couplers 355–358, preferably directional couplers, that each sample a signal output by one of multiple forward paths of signal processing section 330, an inner loop signal combiner 390 coupled to the multiple signal couplers 355–358, an inner loop RF receiving unit 391 coupled to signal combiner 390, an inner loop RF switch 392 coupled to RF receiving unit 391, a RF demodulator 393 coupled to RF switch 392, an analog-to-digital converter (A/D) 394 coupled to RF demodulator 393, and a compensation controller 395 coupled to A/D 394. Outer loop feedback circuit 303 comprises multiple outer loop signal couplers 381–384, preferably directional couplers, that each sample one of multiple signals output by transmit branch forward path 301, an outer loop signal combiner 396 coupled to the multiple outer loop signal couplers 381–384, an outer loop RF receiving unit 397 coupled to signal combiner 396 and to RF switch 392, and RF demodulator 393, analog-to-digital converter (A/D) 394, and compensation controller 395.

Each antenna of the multiple antennas 385–388 operably coupled to transmit branch 300 is associated with a different antenna sector of a multi-sector antenna, such as the antenna elements 121, 131, 141, and 151 associated with transmit branch 201 and further associated with sectors 120, 130, 140, and 150, respectively, of antenna 112. As antenna 112 includes four sectors, hybrid matrix amplification system 300 includes four antennas 385–388 and receives four input signals $S_1$, $S_2$, $S_3$, $S_4$, that is, one input signal for each sector of the four sectors. If a three sector configuration is used, only three antenna elements may be coupled to transmit branch 300, that is, only antenna elements 385–387, and only three input signals, that is, $S_1$, $S_2$, and $S_3$, may be input into the branch. Also, at an output side of transmit branch 300 in a three sector configuration, an unused output port of RF FTM matrix 360 that is otherwise operably coupled to a fourth antenna element 388 instead may be terminated with a 50 ohm load 369.

Baseband FTM 320 is a 4×4 FTM that includes four digital, baseband FTM elements 321–324, that is, a first input FTM element 321, a second input FTM element 322, a first output FTM element 323, and a second output FTM element 324. Each FTM element 321–324 is a 2×2 FTM. Input FTM elements 321 and 322 are each coupled to each of output FTM elements 323 and 324.

RF FTM 360 is a 4×4 FTM that includes four RF FTM elements 361–364, that is, a first input FTM element 361, a second input FTM element 362, a first output FTM element 363, and a second output FTM element 364. Each RF FTM element 361–364 is a 2×2 FTM that comprises a 90° hybrid or 3 dB coupler. An FTM, such as FTM's 320 and 360, distributes signals received at each of multiple input ports of the FTM among multiple output ports of the FTM, so that each FTM output signal is a derivation of all of the FTM input signals and has a specific phase relationship to each of the other FTM output signals.

Transmit branch 300 processes multiple transmit branch input signals $S_1$, $S_2$, $S_3$, and $S_4$, received from an information source, such as processor 110, for transmission via forward path 301 and antenna elements 385–388 as follows. Each transmit branch input signal $S_1$, $S_2$, $S_3$, and $S_4$ corresponds to an antenna element 385–388 coupled to transmit branch 300. That is, input signal $S_1$ is intended for antenna element 385, input signal $S_2$ is intended for antenna element 386, input signal $S_3$ is intended for antenna element 387, and input signal $S_4$ is intended for antenna element 388. Preferably, each of input signals $S_1$, $S_2$, $S_3$, and $S_4$ is a digital baseband input signal, preferably a quadrature modulation information signal, which baseband input signal includes an in-phase (I) component and a quadrature (Q) component.

Transmit branch 300 routes each of input signals $S_1$, $S_2$, $S_3$, and $S_4$ to input section 310 of forward path 301. Input section 310 routes each input signal $S_1$, $S_2$, $S_3$, and $S_4$ to a respective gain and phase adjuster in a first set of gain and phase adjusters 315–318 via a respective forward path signal combiner of a first set of forward path signal combiners 311–314. Each of signal combiners 311–314 is utilized for an injection into forward path 301 of one of multiple outer loop test signals $T_{Ai}$, i=1, 2, 3, 4, during an outer loop error compensation process performed by transit branch 300 as described below. Each gain and phase adjuster 315–318 adjusts a gain and/or a phase of the signal received from the corresponding combiner based on an outer loop control signal of a set of outer loop control signals $A_{Ci}$, i=1, 2, 3, 4, received from compensation controller 395 to produce an adjusted signal. Preferably, a voltage variable attenuator or a variable gain amplifier included in each gain and phase adjuster 315–318 adjusts a gain of the received signal and a voltage variable phase shifter included each gain and phase adjuster 315–318 adjusts a phase of the received signal based on the outer loop control signal received from compensation controller 395. Each gain and phase adjuster 315–318 then routes the adjuster's adjusted signal to a respective input port 320a, 320b, 320c, and 320d of digital, baseband 4×4 FTM 320.

Based on the adjusted signals received from gain and phase adjusters 315–318, FTM 320 produces, as described in greater detail below, output signals $U_1$, $U_2$, $U_3$, and $U_4$ at respective output ports 320e–320h of the FTM. Each output signal $U_1$, $U_2$, $U_3$, and $U_4$ is then routed to signal processing section 330. Signal processing section 330 includes multiple, preferably four, forward paths, wherein the number of forward paths corresponds to the number of output signals $U_1$, $U_2$, $U_3$, and $U_4$ received by section 330 from FTM 320 and to the number of antenna elements 385–388 coupled to transmit branch 300. Each forward path of the four signal processing section 330 forward paths provides for RF modulation and amplification of a signal received from FTM 320. Each signal processing section 330 forward path includes a signal combiner of a second set of forward path signal combiners 331–334 coupled to a gain and phase adjuster of a second set of gain and phase adjusters 335–338, one of multiple digital-to-analog converters (D/A) 340–343 coupled to the gain and phase adjuster, one of multiple RF modulators 345–348 coupled to the D/A, and one of multiple RF power amplifiers 350–353 coupled to the RF modulators. Each of signal combiners 331–334 is utilized by transmit branch 300 for an injection into forward path 301 of one of multiple inner loop test signals $T_{Gi}$, i=1, 2, 3, 4, during an inner loop error compensation process performed by the transmit branch as described below.

In a first forward path of the four forward paths of signal processing section 330, signal $U_1$ is routed to a first gain and phase adjuster 335 in the second set of gain and phase adjusters 335–338 via signal combiner 331. In a second forward path of the four forward paths of section 330, output signal $U_2$ is routed to a second gain and phase adjuster 336 in the second set of gain and phase adjusters 335–338 via signal combiner 332. In a third forward path of the four forward paths of section 330, output signal $U_3$ is routed to a third gain and phase adjuster 337 in the second set of gain and phase adjusters 335–338 via signal combiner 333. In a fourth forward path of the four forward paths of section 330, output signal $U_4$ is routed to a fourth gain and phase adjuster 338 in the second set of gain and phase adjusters 335–338 via signal combiner 334.

Each gain and phase adjuster 335–338 adjusts a gain and/or phase of the signal received from a respective combiner 331–334 based on an inner loop control signal of multiple inner loop control signals $G_{C4}$, $G_{C3}$, $G_{C2}$, and $G_{C1}$ received from compensation controller 395 to produce a further adjusted signal. Preferably, a voltage variable attenuator or a variable gain amplifier included in each gain and phase adjuster 331–334 adjusts a gain of the received signal and a voltage variable phase shifter included each gain and phase adjuster 331–334 adjusts a phase of the received signal based on the inner loop control signal received from compensation controller 395. Each gain and phase adjuster 335–339 then routes the adjuster's gain and/or phase adjusted signal to a respective D/A 340–343. Each D/A 340–343 converts the gain and/or phase adjusted signal received from a respective gain and phase adjuster 335–338 to an analog signal and routes the analog signal to a respective RF modulators 345–348. Each RF modulator 345–348 modulates an RF carrier, $e^{j\omega t}$, with the analog signal received from a respective D/A 340–343 to produce an RF modulated signal and routes the modulated signal to a respective RF power amplifier 350–353. Each RF power amplifier 350–353 amplifies the RF modulated signal received from a respective RF modulator 345–348 to produce a respective amplified signal $P_1$, $P_2$, $P_3$, $P_4$, that is then output by the RF power amplifier and by signal processing section 330. Each of amplified signals $P_1$, $P_2$, $P_3$, $P_4$, is then routed, by section 330, to a respective input port 360a, 360b, 360c, and 360d of RF FTM 360 via a respective inner loop signal coupler 355–358.

Based on the amplified signals $P_1$, $P_2$, $P_3$, $P_4$ received from RF power amplifiers 350–353, RF FTM 360 produces, as described in greater detail below, output signals $R_1$, $R_2$, $R_3$, and $R_4$ at respective output ports 360e–360h of the FTM. FTM 360 routes each output signal $R_1$, $R_2$, $R_3$, and $R_4$ to a respective antenna element 385–388 via a respective duplexer 371–374 and a respective outer loop signal coupler 381–384. As each FTM output signal $R_1$, $R_2$, $R_3$, and $R_4$ propagates from FTM 360 to a respective antenna element 385–388, each FTM output signal $R_1$, $R_2$, $R_3$, and $R_4$ is subjected to a respective output path signal attenuation $a_1$, $A_2$, $A_3$, and $A_4$, which attenuation is represented by elements 375–378 in FIG. 3.

Figure 4:
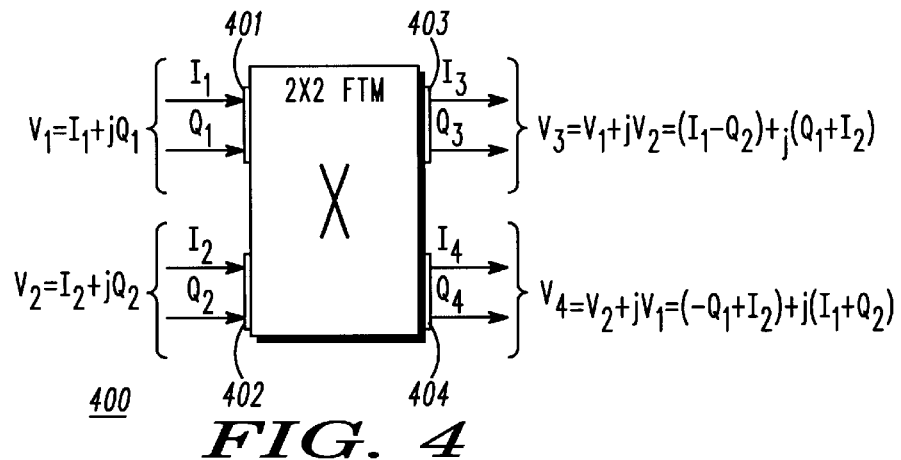
FIG. 4 is a block diagram of a baseband 2×2 Fourier Transform Matrix in accordance with an embodiment of the present invention.
Figure 5:
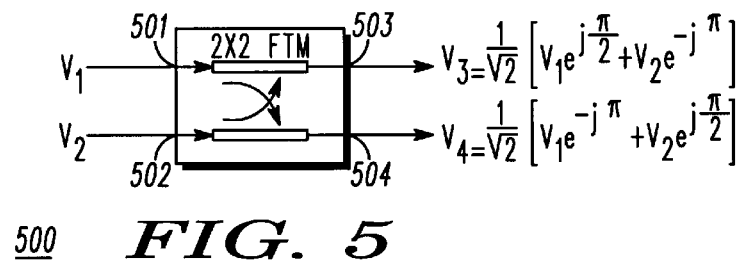
FIG. 5 is a block diagram of a radio frequency 2×2 Fourier Transform Matrix in accordance with an embodiment of the present invention.
Figure 6:
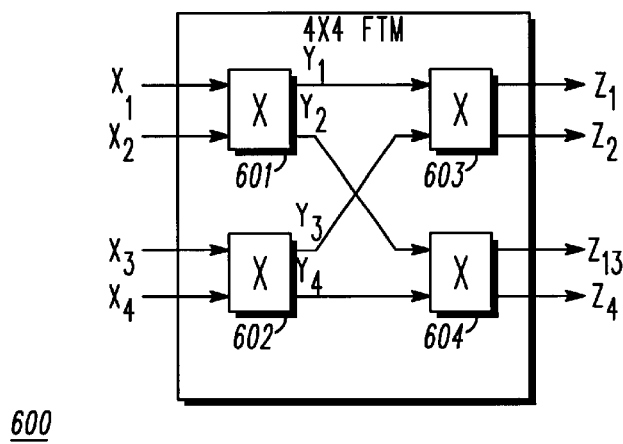
FIG. 6 is a block diagram of a 4×4 Fourier Transform Matrix in accordance with an embodiment of the present invention.

Referring now to FIGS. 4, 5, and 6, a 4×4 FTM, such as FTM's 320 and 360, and 2×2 FTM's, such as FTM elements 321–324 of FTM 320 and FTM elements 361–364 of FTM 360, are illustrated in accordance with an embodiment of the present invention. FIG. 4 is a block diagram of a 2×2 baseband FTM 400, such as FTM elements 321–324, in accordance with an embodiment of the present invention. FTM 400 includes 4 ports: two input ports 401, 402 and two output ports 403, 404. When a first signal, $V_1$, is received at a first input port 401 of the two input ports, the signal is coupled to each of a first output port 403 and a second output port 404, with a 90° phase rotation introduced to the signal coupled to the second output port. As a result, a phase of the signal then transmitted from second output port 404 is offset by 90° from a phase of a signal then transmitted from first output port 403. Similarly, when a second signal, $V_2$, is received at a second input port 402 of the two input ports, the signal is coupled to each of second output port 404 and first output port 403, with a 90° phase rotation introduced to the signal coupled to the first output port. As a result, a phase of the signal then transmitted from first output port 403 is offset by 90° from a phase of a signal then transmitted from second output port 404.

Preferably each of input signals $V_1$ and $V_2$ is a quadrature modulated signal, wherein $V_1=I_1+jQ_1$ and $V_2=I_2+jQ_2$. When $V_1$ is applied to first input port 401 and $V_2$ is applied to second input port 402, the output signals $V_3$ and $V_4$ respectively appearing at output ports 403 and 404 may be represented by the equations $V_3=V_1+jV_2=(I_1-Q_2)+j(Q_1+I_2)$, and $V_4=V_2+jV_1=(-Q_1+I_2)+j(I_1+Q_2)$ The transfer function of FTM element 400 may then be represented by the equation $$\begin{bmatrix} V_3 \\ V_4 \end{bmatrix} = \begin{bmatrix} m_1 & m_2 \\ m_3 & m_4 \end{bmatrix} \begin{bmatrix} V_1 \\ V_2 \end{bmatrix} = \begin{bmatrix} 1 & j \\ j & 1 \end{bmatrix} \begin{bmatrix} V_1 \\ V_2 \end{bmatrix} \quad (1)$$

FIG. 5 is a block diagram of a 2×2 RF FTM 500, such as FTM elements 361–364, in accordance with an embodiment of the present invention. FTM 500 includes 4 ports—two input ports 501, 502 and two output ports 503, 504. When a signal, $V_1$, is received at a first input port 501 of the two input ports, the power or energy of the signal is split into two equal quantities, with one quantity fed to a first output port 503 and the other quantity fed to a second output port 504. A phase of the signal then transmitted from second output port 504 is phase rotated by 90°, or one-quarter wavelength, from a phase of a signal then transmitted from first output port 503. Similarly, when a signal is received at a second input port 502 of the two input ports, the power or energy of the signal is split into two equal quantities, with one quantity fed to first output port 503 and the other quantity fed to second output port 504. A phase of the signal then transmitted from first output port 503 is phase rotated by 90°, or one-quarter wavelength, from a phase of a signal then transmitted from second output port 604.

RF FTM 500 may be represented by the following equations. When $V_1$ is applied to first input port 501 and $V_2$ is applied to second input port 502, the output signals $V_3$ and $V_4$ respectively appearing at output ports 503 and 504 are represented by the equations $$V_3 = \frac{1}{\sqrt{2}} \left[ V_1 e^{j\frac{\pi}{2}} + V_2 e^{-j\pi} \right], \text{ and } V_4 = \frac{1}{\sqrt{2}} \left[ V_1 e^{-j\pi} + V_2 e^{j\frac{\pi}{2}} \right].$$

The transfer function of RF FTM 500 may then be represented by the equation $$\begin{bmatrix} V_3 \\ V_4 \end{bmatrix} = \begin{bmatrix} m_1 & m_2 \\ m_3 & m_4 \end{bmatrix} \begin{bmatrix} V_1 \\ V_2 \end{bmatrix} = \begin{bmatrix} \frac{1}{\sqrt{2}} e^{j\frac{\pi}{2}} & \frac{1}{\sqrt{2}} e^{-j\pi} \\ \frac{1}{\sqrt{2}} e^{-j\pi} & \frac{1}{\sqrt{2}} e^{j\frac{\pi}{2}} \end{bmatrix} \begin{bmatrix} V_1 \\ V_2 \end{bmatrix} \quad (2)$$

Within a constant, the $m_i$'s in each of above equations (1) and (2) are the same.

FIG. 6 is a block diagram of a 4×4 FTM 600, such as FTM's 320 and 360, in accordance with an embodiment of the present invention. FTM 600 includes two input 2×2 FTM's 601, 602, and two output 2×2 FTM's 603, 604. As described above with respect to 2×2 FTM's 400 and 500, each 2×2 FTM 601–604 includes two input ports and two output ports. The input 2×2 FTM's 601 and 602 may together be represented by a transfer function $$\begin{bmatrix} y_1 \\ y_2 \\ y_3 \\ y_4 \end{bmatrix} = \begin{bmatrix} m_1 & m_2 & 0 & 0 \\ m_3 & m_4 & 0 & 0 \\ 0 & 0 & m_1 & m_2 \\ 0 & 0 & m_3 & m_4 \end{bmatrix} \begin{bmatrix} x_1 \\ x_2 \\ x_3 \\ x_4 \end{bmatrix} \quad (3)$$

wherein $x_1$ and $x_2$ are signals respectively input into each of a first input port and a second input port of input FTM element 601, $x_3$ and $x_4$ are signals respectively input into each of a first input port and a second input port of input FTM element 602, $y_1$ and $y_2$ are signals respectively output by each of a first output port and a second output port of input FTM element 601, and $y_3$ and $y_4$ are signals respectively output by each of a first output port and a second output port of input FTM element 602. Coefficients $m_i$, i=1, 2, 3, and 4 are complex numbers that represent the phase and amplitude relationship between the input and output signals of each FTM 601, 602. Ideally, each 2×2 FTM included in a 4×4 FTM is identical to the other 2×2 FTM's of the 4×4 FTM, and therefore the corresponding coefficients $m_i$, i=1, 2, 3, and 4 for each 2×2 FTM 601, 602, 603, and 604 included in 4×4 FTM 600 are the same.

The signals output by first input FTM 601, that is, $y_1$ and $y_2$, are respectively input into a first input port of first output FTM element 603 and a first input port of second output FTM element 604. The signals output by second input FTM 602, that is, $y_3$ and $y_4$, are respectively input into a second input port of first output FTM 603 and a second input port of second output FTM 604. First output FTM 603 outputs a signal $z_1$ from a first output port of FTM 603 and a signal $z_2$ from a second output port of FTM 603, and second output FTM 604 outputs a signal $z_3$ from a first output port of FTM 604 and a signal $z_4$ from a second output port of FTM 604. As a result, a transfer function of FTM 600 may be represented by the following equation, $$\begin{bmatrix} z_1 \\ z_2 \\ z_3 \\ z_4 \end{bmatrix} = \begin{bmatrix} m_1 & m_2 & 0 & 0 \\ m_3 & m_4 & 0 & 0 \\ 0 & 0 & m_1 & m_2 \\ 0 & 0 & m_3 & m_4 \end{bmatrix} \begin{bmatrix} m_1 & m_2 & 0 & 0 \\ 0 & 0 & m_1 & m_2 \\ m_3 & m_4 & 0 & 0 \\ 0 & 0 & m_3 & m_4 \end{bmatrix} \begin{bmatrix} x_1 \\ x_2 \\ x_3 \\ x_4 \end{bmatrix} = \begin{bmatrix} m_1^2 & m_1 m_2 & m_1 m_2 & m_2^2 \\ m_1 m_3 & m_2 m_3 & m_1 m_4 & m_2 m_4 \\ m_1 m_3 & m_1 m_4 & m_2 m_3 & m_2 m_4 \\ m_2^2 & m_3 m_4 & m_3 m_4 & m_4^2 \end{bmatrix} \begin{bmatrix} x_1 \\ x_2 \\ x_3 \\ x_4 \end{bmatrix} \quad (4)$$

By substituting into equation (4) the corresponding 2×2 FTM transfer function components for FTM elements 321–324 of 4×4 baseband FTM 320, or the corresponding 2×2 FTM transfer function components for the FTM elements 361–364 of 4×4 RF FTM 360, an FTM transfer function for the corresponding 4×4 FTM can accordingly be obtained.

Furthermore, with respect to 4×4 baseband FTM 320, when the inputs to the FTM are $S_4$, $S_3$, $S_2$, $S_1$, the outputs of the FTM are $U_1$, $U_2$, $U_3$, $U_4$, and the coefficients of FTM elements 321–324 are $m_1=m_4=1$ and $m_2=m_3=j$. A substitution of these values into equation (4) results in the following equation, $$U = \begin{bmatrix} U_1 \\ U_2 \\ U_3 \\ U_4 \end{bmatrix} = \begin{bmatrix} 1 & j & j & -1 \\ j & -1 & 1 & j \\ j & 1 & -1 & j \\ -1 & j & j & 1 \end{bmatrix} \begin{bmatrix} S_4 \\ S_3 \\ S_2 \\ S_1 \end{bmatrix}. \quad (5)$$

When only $S_1$ is input into FTM 320, equation (5) becomes $$U = \begin{bmatrix} U_1 \\ U_2 \\ U_3 \\ U_4 \end{bmatrix} = \begin{bmatrix} 1 & j & j & -1 \\ j & -1 & 1 & j \\ j & 1 & -1 & j \\ -1 & j & j & 1 \end{bmatrix} \begin{bmatrix} 0 \\ 0 \\ 0 \\ S_1 \end{bmatrix} = \begin{bmatrix} -S_1 \\ jS_1 \\ jS_1 \\ S_1 \end{bmatrix}. \quad (6)$$

From equation (6) it is apparent that the amplitude of the four signals output at the output ports of output FTM elements 323 and 324, and therefore output by FTM 320, is the same as $|S_1|$. Thus, the power is evenly distributed among each of the four output ports of FTM 320 and for any one of the input signals, FTM 320 always distributes the incoming signal power evenly among all four of RF power amplifiers 350–353 of signal processing section 330. Furthermore, by using FTM 360, a desired amplified signal is seen at only one of the multiple transmit antenna elements 385–388. That is, by using both a first FTM 320 and a second FTM 360, a power sharing that is accorded to a signal applied to the first FTM, such as an outer loop test signal $T_{Ai}$, is redirected to a specific antenna element 385–388 by the second FTM.

As is well known to those of ordinary skill in the art, the amplitude and phase of signals that propagate through forward path 301 of transmit branch 300 can change over the time. For example, parts differences due to varied cable lengths or component aging may produce gain and phase mismatches for signals propagating through a transmit branch forward path. Gain and phase mismatch may, in turn, cause an undesired leak of power from a signal propagation path intended for one antenna element to a signal propagation path intended for another antenna element, resulting in interference in other antenna and coverage sectors. In addition, such leakage may result in lower than intended power levels at the intended transmit antenna element. In adaptive antenna array applications, such power leakage may result in an undesired antenna beam pattern.

In order to compensate for such changes, transmit branch 300 executes an error compensation process that provides that signals transmitted by antenna elements 385–388 are as expected. Since a shutting down of a BSS is undesirable once the BSS is set up and operating in the field, the error compensation process may be executed by transmit branch 300 during BSS setup in order to calibrate the BSS or may be self-executed by the BSS during operation, without shutting down, in order to provide compensation for changes in the BSS that occur over time. Transmit branch 300 includes two error compensation loops, an inner feedback loop and an outer feedback loop. Correspondingly, the error compensation process executed by transmit branch 300 may be divided into two stages, a first, inner loop error compensation stage and a second, outer loop error compensation stage. The inner loop error compensation stage compensates for error introduced by the baseband and RF paths between FTMs 320 and 360, that is, in signal processing section 330, while the outer loop error compensation stage compensates for phase and amplitude errors in signals input by transmit branch 300 to antenna elements 385–388.

In the inner loop error compensation stage, error introduced into transmit branch forward path 301 by signal processing section 330 is compensated for by an inner feedback loop comprising signal processing section 330 and inner loop feedback circuit 302. In the outer loop error compensation stage, all residual error introduced into a signal routed through transmit branch forward path 301, after error compensation may be performed by the inner feedback loop, is compensated for by an outer feedback loop comprising transmit branch forward path 301 and outer loop feedback circuit 303. Preferably, the inner loop error compensation stage is executed prior to the execution of the outer loop error compensation stage. However, those who are of ordinary skill in the art realize that either the inner loop error compensation stage or the outer loop error compensation stage may be executed without executing the other, although optimal error compensation is achieved by executing both the inner loop and outer loop error compensation stages.

In order to compensate for amplitude and phase errors, each test signal of a set of predetermined complex inner loop test signals, $T_{Gi}$, i=1, 2, 3, 4, is injected into a forward path of the inner feedback loop, and each test signal a set of predetermined complex outer loop test signals, $T_{Ai}$, i=1, 2, 3, 4, is injected into a forward path of the outer feedback loop. Each test signal of the sets of inner loop and outer loop test signals is orthogonal to an ordinary input signal of transmit branch 300, that is, $S_i$, i=1, 2, 3, 4, (for example, use an unused Walsh code with PN spreading), and to each other. Each test signal of the sets of inner loop and outer loop test signals also comprises less power that the ordinary input signals of transmit branch 300. Since each test signal is orthogonal to the ordinary input signals, $S_i$, i=1, 2, 3, 4, it is permissible to assume that the ordinary input signals are zero. Propagation of each test signal through a forward path of the test signal's corresponding inner loop or outer loop produces multiple inner loop or outer loop output signals. Each loop's feedback circuit samples the loop's multiple output signals and combines the multiple sampled output signals. The loop correlates, or compares, the combined signal with a delayed version of the test signal and produces a control signal based on the correlation, or comparison. The control signal is used by the loop to adjust a signal input into the loop, thereby providing compensation for error introduced by the loop's forward path to a signal input into the loop.

Figure 7:
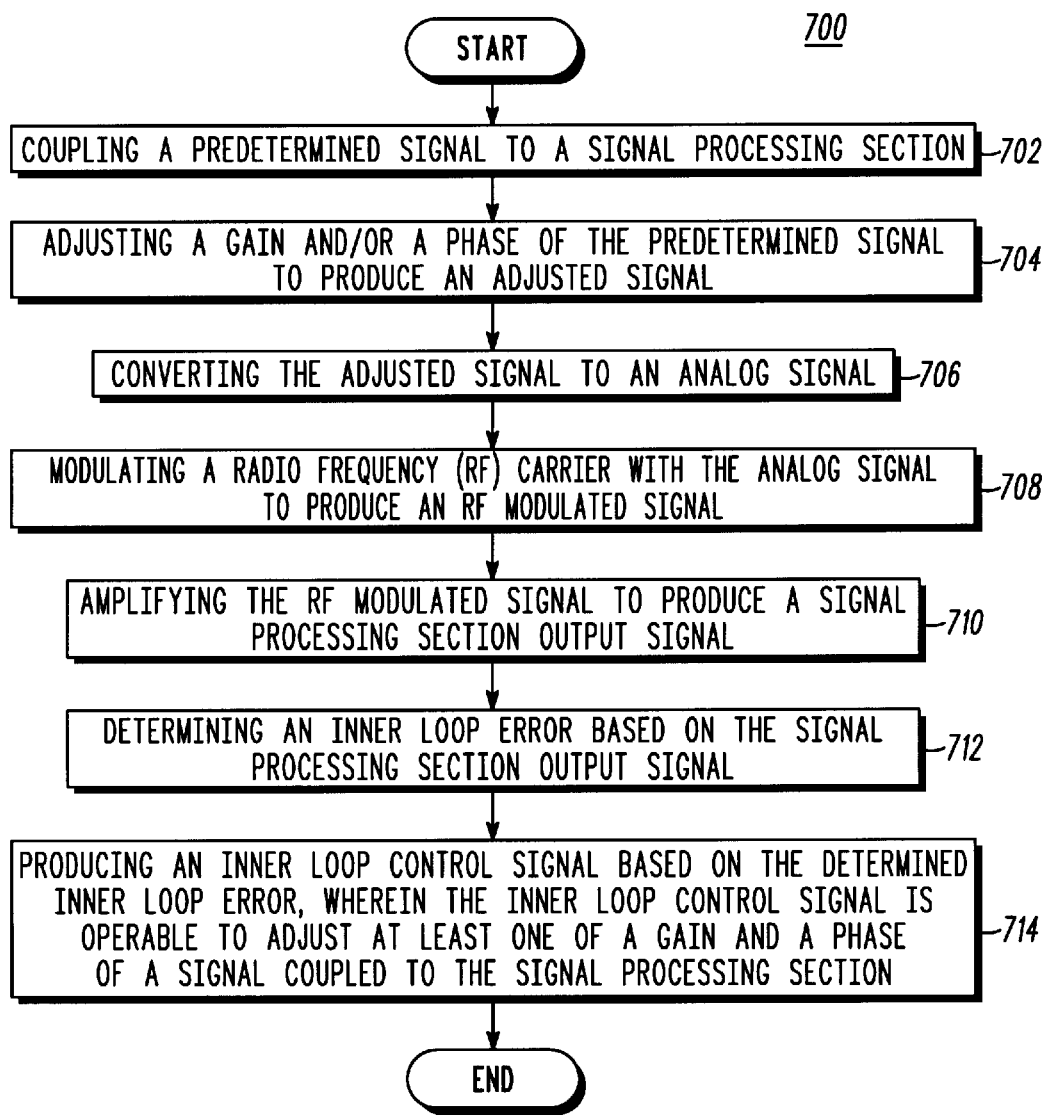
FIG. 7 is a logic flow diagram of steps executed by the transmit branch of FIG. 3 in performing an inner loop error compensation process in accordance with an embodiment of the present invention.

FIG. 7 is a logic flow diagram 700 of steps executed by the inner feedback loop of transmit branch 300 in performing an inner loop error compensation process in accordance with an embodiment of the present invention. As noted above, since the inner loop test signals $T_{Gi}$, i=1, 2, 3, 4, are orthogonal to the transmit branch input signals $S_i$, i=1, 2, 3, 4, the output of the baseband FTM 320 may be assumed to be zero. Logic flow diagram 700 begins when a first test signal, $T_{Gi}$, of the inner loop test signals $T_{Gi}$, i=1, 2, 3, 4, is injected into the inner feedback loop, and in particular is coupled (702) to signal processing section 330. In one embodiment of the present invention, the inner loop test signals may be injected into the inner feedback loop during an error compensation process that is executed during setup, start up, or shutdown of BSS 102, when transmit branch 300 is not receiving any input signals $S_i$, i=1, 2, 3, 4. In another embodiment of the present invention, the test signals may be injected into the inner feedback loop during operation of BSS 300. In the latter instance, since each of test signals $T_{Gi}$, i=1, 2, 3, 4, preferably is orthogonal to each of ordinary input signals $S_1$, $S_2$, $S_3$, and $S_4$, each of signals $U_1$, $U_2$, $U_3$, and $U_4$ output by FTM 320 may be assumed to be zero for the purpose of understanding the principles of an operation of the inner loop error compensation process.

The first test signal is coupled to a first combiner 331 of multiple combiners 331–334 in a first forward path of the multiple forward paths of signal processing section 330. Combiner 331 produces an output signal that is a combination of signal $U_1$ and test signal $T_{Gi}$ (during system setup or system calibration, signals $U_1$, $U_2$, $U_3$, $U_4$, may each be zero). Combiner 331 then routes the, combined signal to gain and phase adjuster 335. Gain and phase adjuster 335 adjusts (704) a gain and/or phase of the combined signal, which includes the test signal, based on control signal $G_{C4}$ received from compensation controller 395 to produce an adjusted signal. Preferably, a voltage variable attenuator or a variable gain amplifier included in gain and phase adjuster 335 adjusts a gain of the signal received from signal combiner 331 and a voltage variable phase shifter included gain and phase adjuster 335 adjusts a phase of the signal received from a signal combiner 331 based on the control signal received from compensation controller 395. The adjusted signal is then routed to D/A 340, where the gain and/or phase adjusted signal is converted (706) to an analog signal that is routed to RF modulator 345. RF modulator 345 modulates (708) an RF carrier, $e_{j\omega t}$, with the analog signal and routes the resulting RF modulated signal to RF power amplifier 350. RF power amplifier 350 amplifies (710) the RF modulated signal to produce an amplified signal, $P_i$, i=1, corresponding to test signal $T_{Gi}$, i=1, which amplified signal is output by RF power amplifier 350 and by signal processing section 330 to produce a signal processing section output signal.

In the embodiment of the present invention wherein the inner loop error compensation process is executed during operation of BSS 300, the remaining signals $U_2$, $U_3$, $U_4$ received by signal processing section 330 from FTM 320 are each routed by their respective signal combiner 332–335 to a respective inner loop signal coupler 355–358 via a respective gain and phase adjuster 336–338, a respective D/A 341–343, a respective RF modulator 345–348, and a respective RF power amplifier 350–353. However, as noted above, since each of test signals $T_{Gi}$, i=1, 2, 3, 4, preferably is orthogonal to each of original signals $S_1$, $S_2$, $S_3$, and $S_4$, each of signals $U_1$, $U_2$, $U_3$, and $U_4$ may be assumed to be zero for the purpose of understanding the principles of an operation of the inner loop error compensation process.

Signal processing section output signal $P_1$, that is, amplified signal $P_1$, is then routed to inner loop feedback circuit 302 via a first inner loop signal coupler 355 of the multiple inner loop signal couplers 355–358. Inner loop feedback circuit 302 then determines (712) an inner loop error based on the signal processing section output signal $P_1$ received by the inner loop feedback circuit and produces (714) an inner loop control signal $G_{Ci}$ based on the determined inner loop error. Inner loop feedback circuit 302 conveys the inner loop control signal $G_{Ci}$ to a gain and phase adjuster 335–338 in the signal processing section 330, where a gain and/or a phase of a signal input into forward path 301 such as an informational signal $S_i$, a subsequently input inner loop test signal $T_{Gi}$, and/or an outer loop test signal $T_{Ai}$, is adjusted based on the inner loop control signal.

Figure 8:
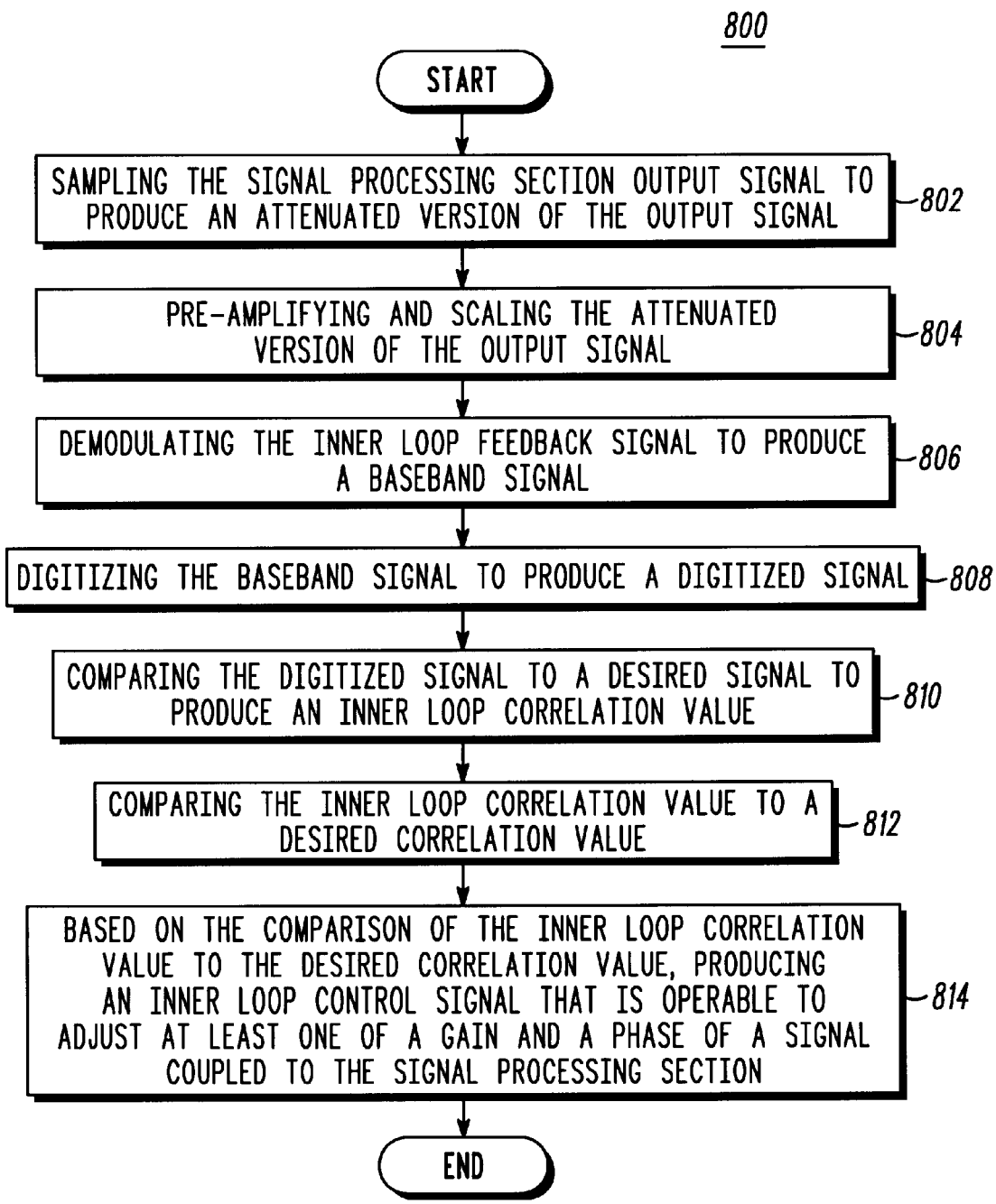
FIG. 8 is a logic flow diagram of steps executed by the inner loop feedback circuit of FIG. 3 to produce an inner loop control signal in accordance with an embodiment of the present invention.

FIG. 8 is a logic flow diagram 800 of the steps executed by inner loop feedback circuit 302 to produce an inner loop control signal $G_{Ci}$ based on a received signal processing section output signal $P_i$ in accordance with an embodiment of the present invention. Logic flow diagram 800 begins when inner loop signal coupler 355 samples (802) signal processing section output signal $P_i$, i=1, to produce an attenuated version of output signal $P_1$ and routes the attenuated output signal to RF receiving unit 391 via signal combiner 390. RF receiving unit 391 pre-amplifies and scales (804) the attenuated output signal received from combiner 390 to produce an inner loop feedback signal $Q_1^i$, i=1 and routes inner loop feedback signal $Q_1^1$ to RF demodulator 393 via RF switch 392. Preferably, RF switch 392 is coupled to, and controlled by, compensation controller 395. Since inner loop feedback signal $Q_1^1$ is a product of the injection of the first inner loop test signal $T_{G1}$ of the multiple inner loop test signals $T_{Gi}$, inner loop feedback signal $Q_1^1$ may be represented in a matrix format by the equation $$Q_1^1 = \underline{a}^T G_1 = \begin{bmatrix} T_{G1} \\ 0 \\ 0 \\ 0 \end{bmatrix} = [\alpha_1 \ \alpha_2 \ \alpha_3 \ \alpha_4] G_1 \begin{bmatrix} T_{G1} \\ 0 \\ 0 \\ 0 \end{bmatrix} \quad (7)$$

wherein the vector $\underline{a}$ is a coefficient vector representative of the four inner loop signal couplers 355–358 and inner loop signal combiner 390.

RF demodulator 393 demodulates (806) the inner loop feedback signal $Q_1^1$ to produce a baseband signal and routes the baseband signal to A/D 394. A/D 394 digitizes (808) the baseband signal to produce a digitized signal $\hat{T}_{Gi}$, i=1, at node $S_{Zi}$, which signal may be represented by the equation $\hat{T}_{Gi} = \alpha_i(G_i + \Delta G_i)T_{Gi}G_{Ci}$, i=1. A/D 394 then routes the digitized signal $\hat{T}_{Gi}$, i=1, to compensation controller 395. Compensation controller 395 compares (810) the digitized signal $\hat{T}_{Gi}$, i=1, to a desired signal $T^*_{Gi}$, i=1, to produce an inner loop correlation value $\hat{f}_i$, i=1. Compensation controller 395 then compares (812) inner loop correlation value $\hat{f}_1$ to a known, desired correlation value $\bar{f}_1$ and, based on the comparison, produces (814) an inner loop control signal $G_{Ci}$, i=1. Compensation controller 395 then conveys control signal $G_{C1}$ to gain and phase adjuster 335, where a gain and/or a phase of a forward path signal input into the gain and phase adjuster, such as an information signal $S_i$, i=1, an outer loop test signal $T_{Ai}$, i=1, and/or an inner loop test signal $T_{Gi}$, i=1, is adjusted based on the control signal.

Compensation controller 395 preferably comprises one or more microprocessors, microcontrollers, digital signal processors (DSPs), combinations thereof or other such devices known to those having ordinary skill in the art, or alternatively may be included in processor 110. For each received digitized signal $\hat{T}_{Gi}$, compensation controller 395 compares the received digitized signal $\hat{T}_{Gi}$ to a desired A/D 394 output signal $T^*_{Gi}$ to produce an inner loop correlation value $\hat{f}$.

Compensation controller 395 then compares inner loop correlation value $\hat{f}$ to a known, desired correlation value $\bar{f}$ and, based on the comparison, produces a control signal $G_{Ci}$ that controller 395 conveys to a gain and phase adjuster 335–338.

When the inner loop error compensation process is executed during operation of BSS 300, the digitized signals $\hat{T}_{Gi}$ received by compensation controller 395 comprises an inner loop test signal portion and an input signal portion. As described in detail above, each inner loop test signal $T_{Gi}$, i=1, 2, 3, 4, is orthogonal to an ordinary input signal of transmit branch 300, that is, $S_i$, i=1, 2, 3, 4, with less power (for example, use an unused Walsh code with PN spreading). Due to the orthogonal relationship, compensation controller 395 is able to separate the inner loop test signal portion of the amplification section output signal front, the input signal portion of the amplification section output signal by utilizing well-known signal processing techniques, such as the techniques used by a signal processor in a typical code division multiple access (CDMA) receiver to separate data intended for the receiver from all other data transmitted in the same bandwidth but coded with Walsh codes different from the intended data. Since the input signals of transmit branch 300, that is, $S_i$, i=1, 2, 3, 4, can be separated out of the inner loop combined signal by compensation controller 395, it is permissible to assume that the input signals $S_i$, i=1, 2, 3, 4, are zero for the purpose of understanding the operation of the inner feedback loop.

Similar to the injection of inner loop test signal $T_{G1}$ into a first signal combiner 331 of multiple input loop signal combiners 331–334 in a first forward path of the multiple forward paths of signal processing section 330, inner loop test signals $T_{G2}$, $T_{G3}$, and $T_{G4}$ are each injected into a respective input loop signal combiner 332–335. Each of signal combiners 332–335 combines a received test signal with respective FTM 320 output signals $U_2$, $U_3$, and $U_4$ (assuming that BSS 102 is in operation when the error compensation process is being executed). As noted above, for the purposes of the present invention, FTM 320 output signals $U_2$, $U_3$, and $U_4$ may be assumed to be zero. Each signal combiner 332–334 then conveys its combined signal to a respective gain and phase adjuster 336–338, where a gain and/or phase of each signal is adjusted to produce an adjusted signal based on a respective control signal $G_{C2}$, $G_{C3}$ and $G_{C4}$ received by the gain and phase adjuster from compensation controller 395. Preferably, a voltage variable attenuator or a variable gain amplifier included in the gain and phase adjuster adjusts a gain of the signal received from the input loop signal combiner and a voltage variable phase shifter included in the gain and phase adjuster adjusts a phase of the signal received from a the input loop signal combiner based on the control signal. Each gain and phase adjuster 336–338 then routes its respective gain and/or phase adjusted signal to a respective D/A 341–343, where the received gain and/or phase adjusted signal is converted to an analog signal that is then routed to a respective multiplier 346–348. Each multiplier 346–348 modulates the received analog signal with an RF carrier, $e^{j\omega t}$, and routes the modulated signal to a respective RF power amplifier 351–353. Each RF power amplifier 351–353 amplifies the received modulated signal to produce a respective amplified signal, $P_2$, $P_3$, $P_4$, which amplified signal is output by the RF power amplifier and by signal processing section 330.

Each signal processing section 330 output signal, that is, each of amplified signals $P_2$, $P_3$, $P_4$, is then routed to inner loop feedback circuit 302 via a respective inner loop signal coupler 356–358 of the multiple inner loop signal couplers 355–358. Each inner loop signal coupler 356–358 samples the respectively received amplified signal $P_2$, $P_3$, $P_4$ to produce an attenuated version of the amplified signal and routes the attenuated amplified signal to RF receiving unit 391. RF receiving unit 391 pre-amplifies and scales each attenuated amplified signal received from an inner loop signal coupler 356–358 to produce respective inner loop feedback signals $Q_1^i$, i=2, 3, and 4, that is, $Q_1^2$, $Q_1^3$, and $Q_1^4$, and routes each inner loop feedback signal $Q_1^2$, $Q_1^3$, and $Q_1^4$ to RF demodulator 393 via RF switch 392.

RF demodulator 393 demodulates each inner loop feedback signal $Q_1^2$, $Q_1^3$, and $Q_1^4$ to produce a baseband signal and routes each baseband signal to A/D 394. A/D 394 digitizes each baseband signal to produce a digitized signal $\hat{T}_{G1}$, i=2, 3, 4, at node $S_{Zi}$, which signals may be represented by the equation $\hat{T}_{Gi}=\alpha_i(G_i+\Delta G_i)T_{Gi}G_{Ci}$, i=2, 3, 4. A/D 394 then routes each digitized signal $\hat{T}_{G1}$, i=2, 3, 4, to compensation controller 395. Compensation controller 395 the compares each digitized signal $\hat{T}_{Gi}$, i=2, 3, 4, to a desired signal $T^*_{Gi}$, i=2, 3, 4, to produce an inner loop correlation value $\hat{f}_i$, i=2, 3, 4. Compensation controller 395 then compares each inner loop correlation value $\hat{f}_i$, i=2, 3, 4 to a known, desired correlation value $\bar{f}_i$, i=2, 3, 4, and, based on each comparison, produces a corresponding control signal $G_{Ci}$, i=2, 3, 4, that is conveyed to a respective gain and phase adjuster 336–338. The control signal is designed to produce an adjustment of a gain and/or a phase of a inner loop test signal input into a gain and phase adjuster 336–338 so that a comparison of the corresponding digitized signal $\hat{T}_{Gi}$ to the desired signal $T^*_{Gi}$ will yield the desired correlation value $\bar{f}_i$.

In one embodiment of the present invention, compensation controller 395 may adjust a gain and/or a phase incrementally, that is, producing a first control signal to implement a first adjustment in an inner loop test signal $T_{Gi}$, measuring and comparing a resulting digitized signal $\hat{T}_{Gi}$ producing a second control signal to implement a further adjustment in the inner loop test signal $T_{Gi}$, again measuring and comparing a resulting digitized signal $\hat{T}_{Gi}$, and so on. In another embodiment of the present invention, compensation controller 395 may adjust a gain and/or a phase by use of a successive approximation routine (SAR). In yet another embodiment of the present invention, controller 395 may make a single adjustment that is designed to align the digitized signal $\hat{T}_{Gi}$ with the desired signal $T^*_{Gi}$ so as to yield the desired correlation value $\bar{f}_i$.

In a vector representation of the above process, inner loop feedback signals $Q_1^2$, $Q_1^3$ and $Q_1^4$ may be obtained by respectively representing each individual inner loop test signal $T_{G2}$, $T_{G3}$, $T_{G4}$ as a following vector $$\begin{bmatrix} 0 \\ T_{G2} \\ 0 \\ 0 \end{bmatrix}, \begin{bmatrix} 0 \\ 0 \\ T_{G3} \\ 0 \end{bmatrix}, \begin{bmatrix} 0 \\ 0 \\ 0 \\ T_{G4} \end{bmatrix}, \qquad (8)$$

with a corresponding inner loop test signal vector that may be represented as $\underline{T}_G=[T_{G1}, T_{G2}, T_{G3}, T_{G4}]^T$. Inner loop feedback circuit 302, and compensation controller 395 in particular, then determines a gain correction vector $G_{Ci}=[G_{C4}, G_{C3}, G_{C2}, G_{C1}]$, based on the inner loop test signal vector, such that the signals output by the forward paths of signal processing section 330 are consistent with each other and equal to a known value.

Control signals $G_{C4}$, $G_{C3}$, $G_{C2}$, and $G_{C1}$ are each designed to adjust the amplified signals produced by each forward path of the multiple forward paths of signal processing section 330 so that the amplified signals are aligned with each other in their phase and their gain. In a matrix format, control signals $G_{C4}$, $G_{C3}$, $G_{C2}$, and $G_{C1}$ may be represented by the following signal processing section 330 gain and phase control signal, or correction, coefficient matrix $G_{CC}$ corresponding-to the gain correction vector $\underline{G}_{Ci}$ $$G_{cc} = \begin{bmatrix} G_{c1} & 0 & 0 & 0 \\ 0 & G_{c2} & 0 & 0 \\ 0 & 0 & G_{c3} & 0 \\ 0 & 0 & 0 & G_{c4} \end{bmatrix} \qquad (9)$$

The gain and phase introduced to each modulated signal by RF power amplifiers 350–353 may also be represented by an RF amplifier gain and phase matrix, as follows $$G = \begin{bmatrix} G_1+\Delta G_1 & 0 & 0 & 0 \\ 0 & G_2+\Delta G_2 & 0 & 0 \\ 0 & 0 & G_3+\Delta G_3 & 0 \\ 0 & 0 & 0 & G_4+\Delta G_4 \end{bmatrix} \qquad (10)$$

wherein $G_1$ is the gain of RF amplifier 350, $G_2$ is the gain of RF amplifier 351, $G_3$ is the gain of RF amplifier 352, $G_4$ is the gain of RF amplifier 353, and $\Delta G_i$, i=1, 2, 3, 4 is the amplifier gain and phase error for each of RF amplifiers 350–353.

A relationship between a test signal $T_{Gi}$ and its corresponding A/D 394 output

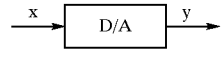

signal $\hat{T}_{Gi}$, then may be represented by the following equations. A transformation for an input, 'x,' and an output, 'y,' of a D/A may be represented by an equation $$y=D_A(x) \qquad (11)$$

When the system is an A/D, such as A/D 394, and 'y' is used as an input and 'x' is used as an output, the system may be represented by an equation $$x=D_A^{-1}(y). \qquad (12)$$

Assume there is only one test signal, $T_{Gi}$, and other signals are all considered to be zero. At the output of RF power amplifier 350–353, that is, at the output of signal processing section 330, the amplified signal $P_i$ may be represented by the equation $$P_i=D_A(T_{Gi}G_{Ci})e^{j\omega t}(G_i+\Delta G_i) \qquad (13)$$

Then, at the output of RF receiving circuit 391, the signal $Q_1$ may be represented by the equation $$Q_1^i=\alpha_i P_i \qquad (14)$$

wherein $\alpha$ is the coupling coefficient representing inner loop signal couplers 355–358 and inner loop signal combiner 390. The output of the A/D 394, that is, can then be represented by the following equation $$\hat{T}_{Gi}=D_A^{-1}(e^{-j\omega t}Q_1)=\alpha(G_i+\Delta G_i)T_{Gi}G_{Ci}. \qquad (15)$$

The value of $G_{Ci}$ can then be updated recursively as following $$G_{Ci}(k) = \frac{\bar{f}}{\hat{f}} G_{Ci}(k-1) \quad (i = 1, 2, 3, 4) \tag{16}$$

wherein $\hat{f}$ is the correlation value between a desired test signal T*Gi and the actual output signal $\hat{T}_{G1}$, received from A/D 394 and $\bar{f}$ is a desired calibrated correlation value obtained during off-line calibration. With a calibrated subsystem, $\Delta G_i = 0$, and based on equation (16), the output of A/D 394 becomes $$\hat{T}_{Gi} = \alpha G_i T_{Gi} G_{Ci}. \tag{17}$$

Performing correlation, $\bar{f}$ may be represented by the following equation $$\bar{f} = \sum_n \alpha G_i G_{ci} T_{Gi} T_{Gi}^* = \alpha G_i G_{ci} \sum_n T_{Gi} T_{Gi}^*. \tag{18}$$

Assuming that $$\sum_n T_{Gi} T_{Gi}^* = 1, \tag{19}$$

wherein $T_{Ci}^*$ is the desired output of A/D 394, then equation (14) may be simplified to the following equation $$\bar{f} = \alpha G_i G_{ci}. \tag{20}$$

Similarly, $\hat{f}$ may be represented by the following equation $$\hat{f} = \sum_n \alpha(G_i + \Delta G_i) G_{ci} T_{Gi} T_{Gi}^* = \alpha(G_i + \Delta G_i) G_{ci}. \tag{21}$$

Then, combining equations (20) and (21), $$\frac{\bar{f}}{\hat{f}} = \frac{G_i}{G_i + \Delta G_i}, \tag{22}$$

and equation (16) can be written as $$G_{Ci}(k) = \frac{G_i}{G_i + \Delta G_i} G_{Ci}(k-1) \quad (i = 1, 2, 3, 4) \tag{23}$$

When $\Delta G_i$ is positive, meaning $G_i$ is increasing, the ratio $G_i/(G_i + \Delta G_i)$ becomes smaller, which causes the value of $G_{ci}$ to decrease. When $\Delta G_i$ is negative, meaning $G_i$ is decreasing, the ratio $G_i/(G_i + \Delta G_i)$ becomes larger, which causes the value of $G_{ci}$ to increase. Thus, the value of $G_{ci}$ always moves to the opposite direction of $\Delta G_i$, providing an effective compensation to the error of power amplifier gain.

In sum, in the inner loop compensation process, each test signal of a set of predetermined complex inner loop test signals, $T_{Gi}$, i=1, 2, 3, 4, is injected into a forward path of the inner feedback loop, and in particular into a forward path of a signal processing section 330. Propagation of the inner loop test signal through a forward path of the signal processing section 330 produces a corresponding inner loop output signal $P_i$, i=1, 2, 3, 4. The inner loop feedback circuit 302 samples the inner loop output signal and compensation controller 395 of the inner loop feedback circuit 302 compares the sampled signal to a desired signal, preferably a delayed version of the test signal, to produce a comparison. Preferably, the sampled signal is correlated with the desired inner loop output signal to produce a correlation value, which correlation value is then compared to a desired correlation value to produce the comparison. Based on the comparison, compensation controller 395 produces a corresponding inner loop control signal $G_{Ci}$, i=1, 2, 3, 4, that is supplied to a corresponding gain and phase adjuster 335–338 in a propagation path of the test signal through signal processing section 330. Based on the received control signal $G_{Ci}$, i=1, 2, 3, 4, the corresponding gain and phase adjuster 335–338 adjusts at least one of a gain and a phase of a signal subsequently coupled to the signal processing section 330 in order to optimize a correlation of the desired inner loop output signal and an inner loop output signal derived from the subsequently coupled signal.

Figure 9:
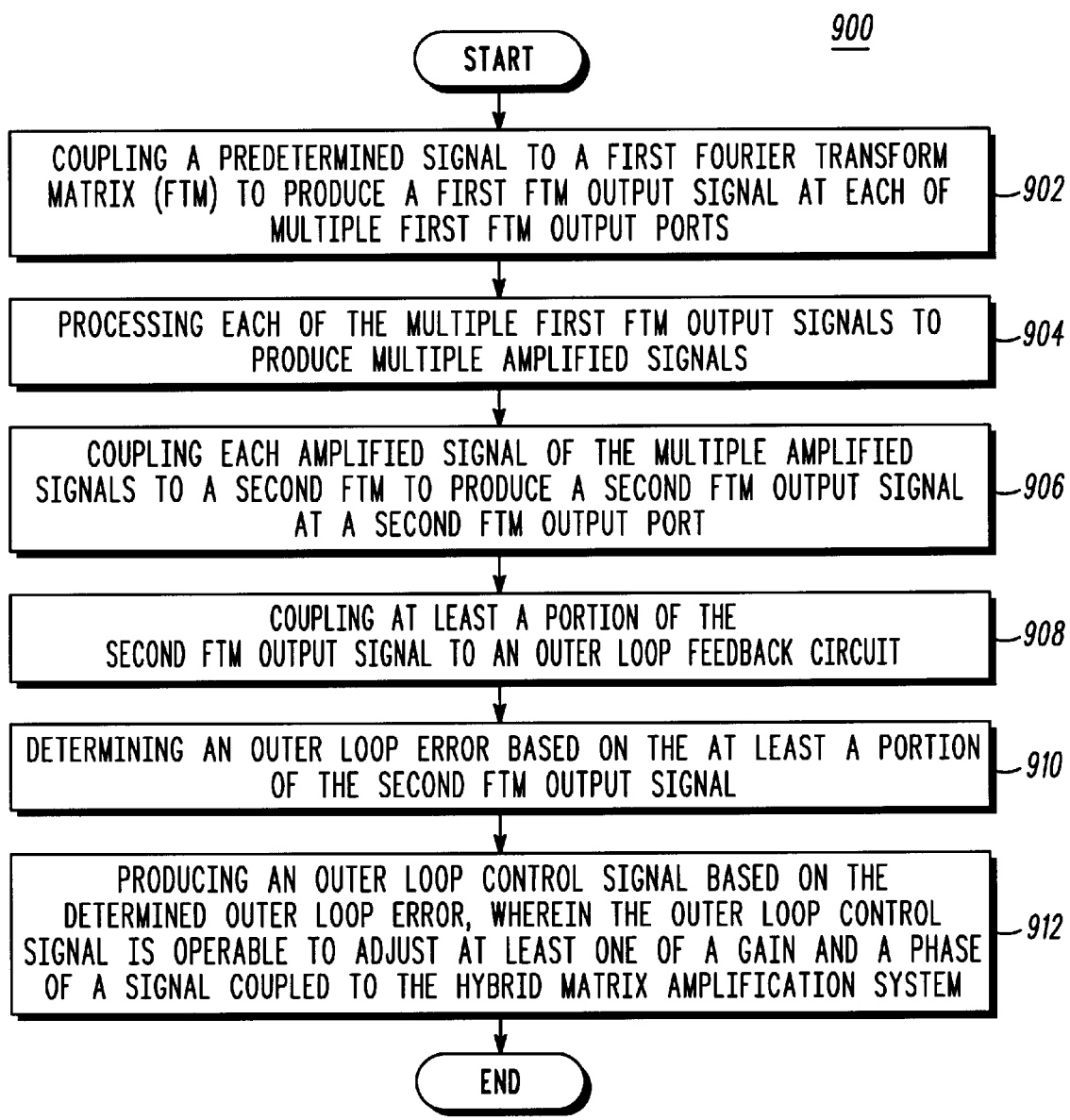
FIG. 9 is a logic flow diagram of steps executed by the transmit branch of FIG. 3 in performing an outer loop error compensation process in accordance with an embodiment of the present invention.

FIG. 9 is a logic flow diagram 900 of steps executed by the outer feedback loop of transmit branch 300 in performing an outer loop error compensation process in accordance with an embodiment of the present invention. Logic flow diagram 900 begins when a first test signal, $T_{A4}$, of the outer loop test signals $T_{Ai}$, i=1, 2, 3, 4, is injected into the outer feedback loop and is coupled (902) to FTM 320 via a first signal combiner 311 of the multiple signals combiners 311–314 and a first gain and phase adjuster 315 of the multiple gain and phase adjusters 315–318. Similar to the inner loop error compensation stage and inner loop test signals $T_{Gi}$, i=1, 2, 3, 4, in one embodiment of the present invention, the outer loop test signals may be injected into the outer feedback loop during an error compensation process that is executed during setup, start up, or shutdown of BSS 102, when transmit branch 300 is not receiving any input signals $S_i$, i=1, 2, 3, 4. In another embodiment of the present invention, the test signals may be injected into the outer feedback loop during operation of BSS 300. In the latter instance, since each of test signals $T_{Ai}$, i=1, 2, 3, 4, preferably is orthogonal to each of ordinary input signals $S_1$, $S_2$, $S_3$, and $S_4$, each of input signals $S_1$, $S_2$, $S_3$, and $S_4$ may be assumed to be zero for the purpose of understanding the principles of an operation of the outer loop error compensation process.

Signal combiner 311 produces an output signal that is a combination of input signal $S_1$ and test signal $T_{G1}$ (assuming that BSS 102 is in operation during the execution of the outer loop error compensation process). Combiner 311 then routes the combined signal to a first gain and phase adjuster 315 of the first set of multiple gain and phase adjusters 315–318. Gain and phase adjuster 315 adjusts a gain and/or phase of the combined signal based on an outer loop control signal $A_{C4}$ received from compensation controller 395. Preferably, a voltage variable attenuator or a variable gain amplifier included in gain and phase adjuster 315 adjusts a gain of the signal received from combiner 311 and a voltage variable phase shifter included gain and phase adjuster 315 adjusts a phase of the signal received from a combiner 311 based on the control signal received from compensation controller 395. The gain and/or phase adjusted signal is then routed to FTM 320, where the adjusted signal is coupled to each of FTM 320 output ports 320e–320h to produce multiple FTM output signals $U_1$, $U_2$, $U_3$, and $U_4$ as described above. Each output signal of the multiple FTM output signals $U_1$, $U_2$, $U_3$, and $U_4$ is then routed to a forward path of the multiple forward paths of signal processing section 330.

In each forward path of the multiple forward paths of signal processing section 330, a received FTM output signal $U_1$, $U_2$, $U_3$, and $U_4$ is modulated onto an RF carrier and amplified (904) to produce an amplified RF modulated signal. In particular, each of the multiple FTM output signals $U_1$, $U_2$, $U_3$, and $U_4$ is routed to a respective RF modulator 345–348 via a respective signal combiner 331–334, a respective gain and phase adjuster 335–338, and a respective D/A 340–343. Preferably, during the outer loop error compensation process, no inner loop test signals are coupled to signal combiners 331–334 and each combiner 331–334 routes its respectively received signal $U_1$, $U_2$, $U_3$, and $U_4$ to a respective gain and phase adjuster 335–338. Each gain and phase adjuster 335–338 adjusts a gain and/or phase of the signal received from a respective combiner 331–334 based on a respective control signal $G_{C4}$, $G_{C3}$, $G_{C2}$, $G_{C1}$ received from compensation controller 395 as described above. Preferably, a voltage variable attenuator or a variable gain amplifier included in each gain and phase adjuster 335–338 adjusts a gain of the signal received from a respective signal combiner 331–334 and a voltage variable phase shifter included the gain and phase adjuster 335–338 adjusts a phase of the signal received from a respective signal combiner 331–334 based on the control signal received from compensation controller 395.

Each gain and phase adjuster 335–338 routes the adjuster's gain and/or phase adjusted signal to a respective D/A 340–343. Each D/A 340–343 converts the gain and/or phase adjusted signal received from a respective gain and phase adjuster 335–338 to an analog signal and routes the analog signal to a respective RF modulator 345–348. Each RF modulator 345–348 modulates an RF carrier, $e^{j\omega t}$, with the analog signal received from a respective D/A 340–343 to produce an RF modulated signal and routes the modulated signal to a respective RF power amplifier 350–353. Each RF power amplifier 350–353 amplifies the RF modulated signal received from a respective RF modulator 345–348 to produce a respective amplified signal $P_1$, $P_2$, $P_3$, $P_4$, that is then output by the RF power amplifier and by signal processing section 330. Each of amplified signals $P_1$, $P_2$, $P_3$, and $P_4$, is then coupled (906), by section 330, to a respective input port 360a, 360b, 360c, and 360d of 4×4 RF FTM 360 via respective inner loop signal couplers 355–358.

For each test signal $T_{Ai}$, i=1, 2, 3, 4, FTM 360 then produces a corresponding output signal $R_i$, i=1, 2, 3, 4, at a respective output port 360e–360h of the FTM. Each output signal $R_i$, i=1, 2, 3, 4, is based on the amplified signals $P_1$, $P_2$, $P_3$, and $P_4$ that are produced by, and received from, RF power amplifiers 350–353 in response to the coupling of the corresponding test signal $T_{Ai}$ to forward path 301. FTM 360 routes the corresponding output signal $R_i$, i=1, 2, 3, 4, to a respective antenna element 385–388 via a respective duplexer 371–374 and a respective outer loop signal coupler 381–384. In the course of propagating from FTM 360 to antenna elements 385–388, each output signal $R_i$, i=1, 2, 3, 4, is subject to a respective output path attenuation $A_i$, i=1, 2, 3, 4. As a result, an attenuated version of the output signal $R_i$, i=1, 2, 3, 4, that is, a respective forward path or transmitter branch output signal $O_i$, i=1, 2, 3, 4, is coupled to a respective antenna element 385–388.

For each test signal $T_{Ai}$, i=1, 2, 3, 4, at least a portion of the corresponding output signal $O_i$, i=1, 2, 3, 4, is coupled (908) to outer loop feedback circuit 303 via outer loop signal couplers 381–384. Each outer loop signal coupler 381–384 is coupled between a respective duplexer 371–374 and a respective antenna element 385–388 and is designed to sample the respective output signal $O_1$, $O_2$, $O_3$, and $O_4$ being coupled to a respective antenna element 385–388. Each outer loop signal coupler 381–384 samples a respective forward path, or transmit branch, output signal $O_1$, $O_2$, $O_3$, and $O_4$ to produce an attenuated forward path output signal. For each output signal $O_i$, i=1, 2, 3, 4, outer loop feedback circuit 303 determines (910) an outer loop error based on the sampled version of the output signal, that is, the attenuated forward path output signal produced by a respective outer loop signal coupler 381–384. Based on the determined outer loop error, outer loop feedback circuit 303 then produces (912) a corresponding outer loop control signal $A_{Ci}$, i=1, 2, 3, 4. Outer loop feedback circuit 303 conveys each outer loop control signal $A_{Ci}$, i=1, 2, 3, 4, to a respective gain and phase adjuster 315–318 in input section 310 of forward path 301, where a gain and/or a phase of a signal input into forward path 301, such as an informational signal Si and/or a subsequently input outer loop test signal $T_{Ai}$, is adjusted based on the outer loop control signal.

Figure 10:
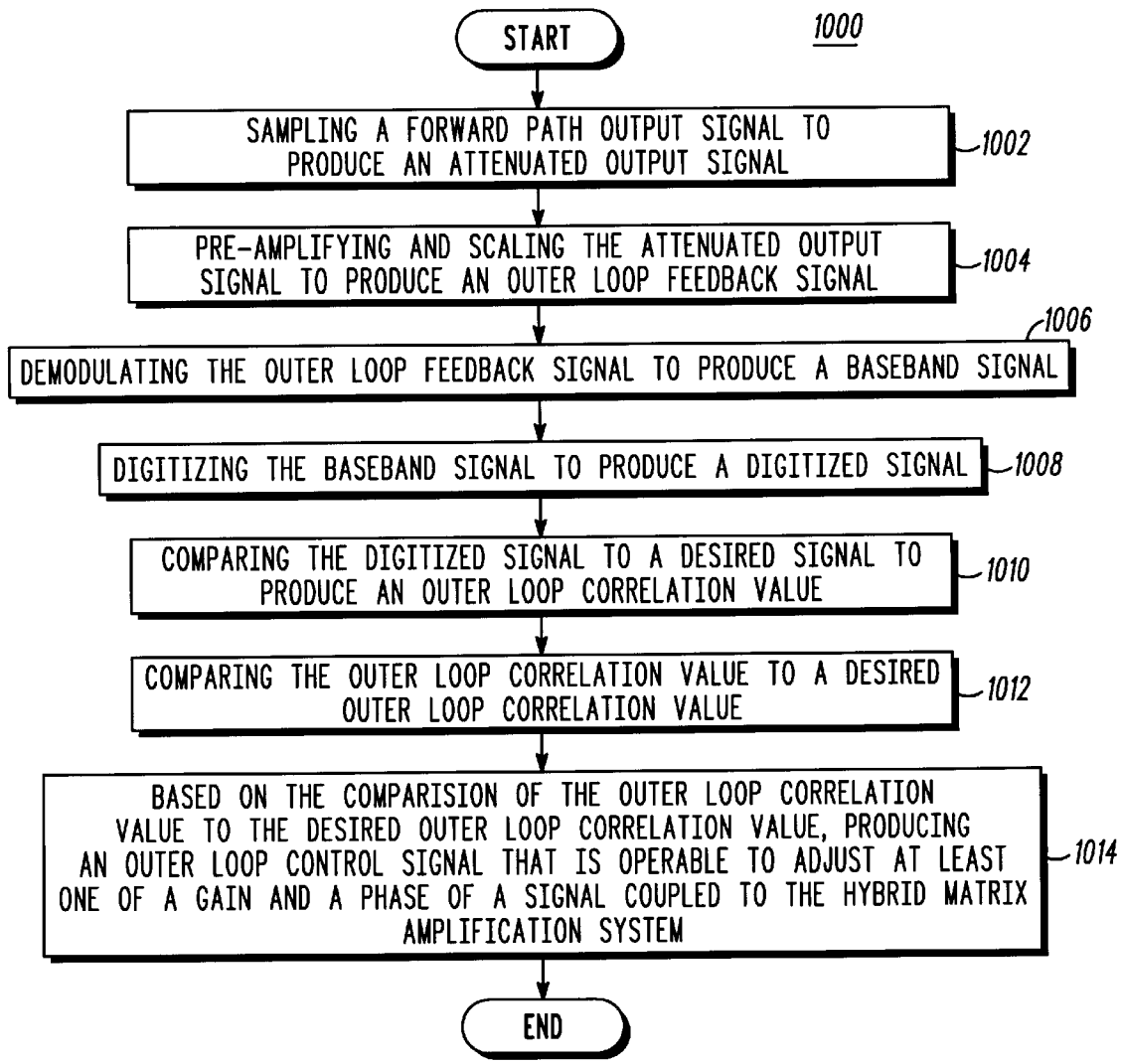
FIG. 10 is a logic flow diagram of steps executed by the outer loop feedback circuit of FIG. 3 to produce an outer loop control signal in accordance with an embodiment of the present invention.

FIG. 10 is logic flow diagram 1000 of the steps executed by outer loop feedback circuit 303 to produce an outer loop control signal $A_{Ci}$ based on a coupled version of a forward path, or transmit branch, output signal $O_i$ in accordance with an embodiment of the present invention. Logic flow diagram 1000 begins when an outer loop signal coupler 381–384 samples (1002) a respective forward path, or transmit branch, output signal $O_i$, i=1, 2, 3, 4, to produce an attenuated forward path output signal. Each attenuated output signal is then routed by the signal's respective signal coupler to outer loop signal combiner 396. Preferably, transmit branch 300 is designed such that an electrical distance from each antenna element of antenna elements 385–388 to outer loop signal combiner 396 is approximately the same as an electrical distance from each of the other antenna elements of antenna elements 385–388 to the outer loop signal combiner. The outer loop signal coupler 381–384 then conveys (1004) the attenuated transmit branch output signal received from a signal coupler 381–384 to outer loop RF receiving unit 397 via outer loop signal combiner 396.

RF Receiving unit 397 pre-amplifies and scales (1006) the outer loop combined signal received from an outer loop signal coupler 381–384 to produce an outer loop feedback signal $Q_2^1$. As a result, an injection of the first test signal $T_{A1}$ yields an outer loop feedback signal of $Q_2^1$. Similarly, an injection of each of test signals $T_{A2}$, $T_{A3}$, and $T_{A4}$ respectively into signal combiners 312–314 yields respective outer loop feedback signals $Q_2^2$, $Q_2^3$ and $Q_2^4$ at the output of RF receiving unit 397.

Similar to the processing of the inner loop feedback signals $Q_1^1$, $Q_1^2$, $Q_1^3$ and $Q_1^4$, each outer loop feedback signal $Q_2^1$, $Q_2^2$, $Q_2^3$, and $Q_2^4$ is routed by RF receiving unit 397 to RF demodulator 393 via RF switch 392. RF demodulator 393 demodulates (1008) each outer loop feedback signal $Q_2^1$, $Q_2^2$, $Q^{23}$ and $Q_2^4$ received from RF switch 392 to produce a baseband signal and routes each baseband signal to A/D 394. A/D 394 then digitizes (1010) each received baseband signal to produce a digitized signal $\hat{T}_{Ai}$ at node $S_{Zi}$ and routes digitized signal $\hat{T}_{Ai}$ to compensation controller 395. For each received digitized signal $\hat{T}_{Ai}$, compensation controller 395 compares (1012) the received digitized signal $\hat{T}_{Ai}$ to a desired A/D 394 output signal $T^*_{Ai}$ to produce an outer loop correlation value $\hat{g}$. Compensation controller 395 then compares (1014) outer loop correlation value $\hat{g}$ to a desired outer loop correlation value $\bar{g}$ and, based on the comparison, produces (1016) a control signal $A_{Ci}$ that is conveyed to one of gain and phase adjusters 311–314.

Similar to the inner loop error compensation process, in one embodiment of the present invention, compensation controller 395 may adjust a gain and/or a phase incrementally, that is, producing a first control signal to implement a first adjustment in an outer loop test signal $T_{Ai}$, measuring and comparing a resulting digitized signal $\hat{T}_{Ai}$, producing a second control signal to implement a further adjustment in the outer loop test signal $T_{Ai}$, again measuring and comparing a resulting digitized signal $\hat{T}_{Ai}$, and so on. In another embodiment of the present invention, compensation controller 395 may adjust a gain and/or a phase by use of a successive approximation routine (SAR). In yet another embodiment of the present invention, controller 395 may make a single adjustment that is designed to align the digitized signal $\hat{T}_{Ai}$, with the desired signal $T^*_{Ai}$ so as to yield the desired correlation value $\bar{\Gamma}_i$.

When the outer loop error compensation process is executed when BSS 102 is in operation, compensation controller 395 may receive a derivative of the forward path output signal that comprises an outer loop test signal portion and an input signal portion of the outer loop combined signal to produce an outer loop forward path output signal $Q_2^1$. As described in detail above, each outer loop test signal $T_{Ai}$, i=1, 2, 3, 4, is orthogonal to an ordinary input signal of transmit branch 300, that is, $S_i$, i=1, 2, 3, 4, with less power (for example, use an unused Walsh code with PN spreading). Due to the orthogonal relationship, compensation controller 395 is able to separate the outer loop test signal portion of the output loop output signal from the input signal portion of the output loop output signal by utilizing well-known signal processing techniques. Since the input signals of transmit branch 300, that is, $S_i$, i=1, 2, 3, 4, can be separated out of the output loop output signal by compensation controller 395, it is permissible to assume that the input signals $S_i$, i=1, 2, 3, 4, are zero for the purpose of understanding the operation of the outer feedback loop.

In a matrix format, the outer feedback loop may be represented by the following equations. The outer feedback loop control signal, or correction, coefficient matrix is $$A_{cc} = \begin{bmatrix} A_{c4} & 0 & 0 & 0 \\ 0 & A_{c3} & 0 & 0 \\ 0 & 0 & A_{c2} & 0 \\ 0 & 0 & 0 & A_{c1} \end{bmatrix}, \quad (24)$$

wherein $A_{CC}$ is a matrix representation of an outer loop test signal vector $A_{Ci}=[A_{C4}, A_{C3}, A_{C2}, A_{C1}]$. The transmit branch 300 error matrix at the input to antenna elements 385–388 is $$A = \begin{bmatrix} A_1 + \Delta A_1 & 0 & 0 & 0 \\ 0 & A_2 + \Delta A_2 & 0 & 0 \\ 0 & 0 & A_3 + \Delta A_3 & 0 \\ 0 & 0 & 0 & A_4 + \Delta A_4 \end{bmatrix}. \quad (25)$$

wherein $A_1$ is the attenuation introduced to a signal as the signal propagates from the first, output port of signal processing section 330 to a first antenna element 385 of the multiple antenna elements 385–388, that is, along a first path through output section 370, $A_2$ is the attenuation introduced to a signal between the second output port of signal processing section 330 and a second antenna element 386 of the multiple antenna elements 385–388, that is, along a second path through output section 370, $A_3$ is the attenuation introduced to a signal between the third output port of signal processing section 330 and a third antenna element 387 of the multiple antenna elements 385–388, that is, along a third path through output section 370, $A_4$ is the attenuation introduced to a signal between the fourth output port of signal processing section 330 and a fourth antenna element 388 of the multiple antenna elements 385–388, that is, along a fourth path through output section 370, and $\Delta G_i$, i=1, 2, 3, 4, corresponds to the variation in attenuation among the four signal propagation paths of output section 370.

From equations (4), (5), (10), and (25) a general expression for the relationship between inputs and outputs of transmit branch 300 may be obtained as follows $$\begin{bmatrix} O_1 \\ O_2 \\ O_3 \\ O_4 \end{bmatrix} = \frac{1}{2} e^{j w t} GA \begin{bmatrix} -1 & -j & -j & 1 \\ -j & 1 & -1 & -j \\ -j & -1 & 1 & -j \\ 1 & -j & -j & -1 \end{bmatrix} \begin{bmatrix} 1 & j & j & -1 \\ j & -1 & 1 & j \\ j & 1 & -1 & j \\ -1 & j & j & 1 \end{bmatrix} \begin{bmatrix} S_4 \\ S_3 \\ S_2 \\ S_1 \end{bmatrix} \quad (26)$$

Where G and A are diagonal matrices defined above, $\underline{O}_{out}=[O_1\ O_2\ O_3\ O_4]^T$ is the output vector and $\underline{S}[S_4\ S_3\ S_2\ S_1]^T$ the input vector. After simplification, equation (26) becomes $$\begin{bmatrix} O_1 \\ O_2 \\ O_3 \\ O_4 \end{bmatrix} = e^{jwt} GA \begin{bmatrix} 0 & 0 & 0 & 2 \\ 0 & 0 & 2 & 0 \\ 0 & 2 & 0 & 0 \\ 2 & 0 & 0 & 0 \end{bmatrix} \begin{bmatrix} S_4 \\ S_3 \\ S_2 \\ S_1 \end{bmatrix} = 2 e^{jwt} GA \begin{bmatrix} S_4 \\ S_3 \\ S_2 \\ S_1 \end{bmatrix}. \quad (27)$$

Therefore, each input signal is seen at its corresponding antenna port respectively, and no cross talk will happen.

The transfer function of entire system is $$\underline{Q}_{out}=e^{jwt} A \cdot H \cdot G \cdot G_{cc}(\underline{T}_G + F \cdot A_{cc}(\underline{T}_A + \underline{S})) \quad (28)$$

where $\underline{T}_A=[T_{A4}\ T_{A3}\ T_{A2}\ T_{A1}]^T$ is the test signal vector input at combiners 311–314, and matrices $A_{cc}$ and $G_{cc}$ are defined in equations (9) and (24) and as described above.

By setting the input $\underline{S}=0$ (orthogonal assumption), $\underline{T}_G=0$, and using $\underline{T}_A$ as the input vector, compensation controller 395 may utilize a method to determine the proper values for $A_{cc}$, that is, for control signal coefficients $A_{C1}, A_{C2}, A_{C3}$, and $A_{C4}$, that is similar to the method utilized by the controller with respect to determining the to inner loop correction coefficients $G_{C1}, G_{C2}, G_{C3}$, and $G_{C4}$. $Q_2$ may be represented by the equation $$Q_2 = \underline{\beta}^T \underline{Q}_{out} = [\beta_1\ \beta_2\ \beta_3\ \beta_4] \underline{Q}_{out} \quad (29)$$

wherein the vector $\underline{\beta}$ is a coefficient vector representative of the four outer loop signal couplers 381–384 and outer loop signal combiner 396.

With a known $\underline{G}_{cc}$, which is determined during the inner loop error compensation process, and with $\underline{S}=0$ and $\underline{T}_G=0$, we have an output with inputs $\underline{T}_A$ $$\underline{Q}_{out}=e^{jwt} \cdot A \cdot H \cdot G \cdot G_{cc} \cdot F \cdot A_{cc} \cdot \underline{T}_A \quad (30)$$

Letting $\underline{T}_A$ to be one of the following vectors as the outer loop input test signal $$\begin{bmatrix} T_{A4} \\ 0 \\ 0 \\ 0 \end{bmatrix}, \begin{bmatrix} 0 \\ T_{A3} \\ 0 \\ 0 \end{bmatrix}, \begin{bmatrix} 0 \\ 0 \\ T_{A2} \\ 0 \end{bmatrix} \text{ or } \begin{bmatrix} 0 \\ 0 \\ 0 \\ T_{A1} \end{bmatrix} \quad (31)$$

then signal $Q_2^i$ may be represented by the following equation $$Q_2^i = \underline{\beta}^T \cdot e^{jwt} \cdot A \cdot H \cdot G \cdot G_{cc} \cdot F \cdot A_{cc} \cdot \underline{T}_A \quad (32)$$

where i=1, 2, 3, and 4, and where $Q_2^i$ corresponds to the $i^{th}$ non-zero element in the vector $\underline{T}_A$. For an input of test signal $T_{Ai}$, node $S_{zi}$ yields an output signal $\hat{T}_{Ai}$. Similar to the computation of $\hat{f}$, correlation value is $\hat{g}$ is computed by the following equation $$\hat{g} = \sum_n \hat{T}_{Ai} T_{Ai}^*. \quad (33)$$

A value of $A_{ci}$ is then updated as $$A_{Ci}(k) = \frac{\bar{g}}{\hat{g}} A_{Ci}(k-1) \quad i = 1, 2, 3, 4. \quad (34)$$

where $\bar{g}$ is a known, desired correlation value based on a standard measurement as is the case with $\bar{f}$. Thus all values of $G_{ci}$ and $A_{ci}$ can be found for the purpose of gain error correction.

Similar to $G_{ci}$, $A_{ci}$ may be represented by the following equation $$A_{Ci}(k) = \frac{A_i}{A_i + \Delta A_i} A_{ci}(k-1) \quad (35)$$

Similar to $\Delta G_i$, when $\Delta A_i$ is positive, meaning $A_i$ is increasing, the ratio $A_i/(A_i+\Delta A_i)$ becomes smaller, which causes the value of $A_{Ci}$ to decrease. When $\Delta A_i$ is negative, meaning $A_i$ is decreasing, the ratio $A_i/(A_i+\Delta A_i)$ becomes larger, which causes the value of $A_{Ci}$ to increase. Thus, the value of $A_{Ci}$ always moves to the opposite direction of $\Delta A_i$, providing an effective compensation to the error of transmit branch 300.

In sum, in the outer loop compensation process, each test signal of a set of predetermined complex outer loop test signals, $T_{Ai}$, i=1, 2, 3, 4, is injected into a forward path 301 of hybrid matrix amplification system 300. Propagation of the outer loop test signal through forward path 301 produces a corresponding outer loop output signal $R_i$, i=1, 2, 3, 4. The outer loop feedback circuit 303 samples the outer loop output signal and compensation controller 395 compares the sampled signal to a desired signal, preferably a delayed version of the test signal, to produce a comparison. Preferably, the sampled signal is correlated with the desired outer loop output signal to produce a correlation value, which correlation value is then compared to a desired correlation value to produce the comparison. Based on the comparison compensation controller 395 produces a corresponding outer loop control signal $A_{Ci}$, i=1, 2, 3, 4, that is supplied to a corresponding gain and phase adjuster 315–318 in a propagation path of the test signal through forward path 301. Based on the received control signal $A_{Ci}$, i=1, 2, 3, 4, the corresponding gain and phase adjuster 315–318 adjusts at least one of a gain and a phase of a signal subsequently coupled to the forward path 301 of hybrid matrix amplification system 300 in order to optimize a correlation of the desired outer loop output signal and an outer loop output signal derived from the subsequently coupled signal.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for error compensation in a hybrid matrix amplification system comprising:
    an input signal forward path comprising:
        an input Fourier Transform Matrix (FTM) having a plurality of input ports and a plurality of output ports;
        a signal processing section having plurality of input ports and a plurality of output ports, wherein each input port of the plurality of signal processing section input ports is coupled to an output port of the plurality of output ports of the input FTM;
        an output FTM having a plurality of input ports and a plurality of output ports, wherein each input port of the plurality of input ports of the output FTM is coupled to an output port of the plurality of signal processing section output ports; and
    an outer loop feedback circuit coupled to the input signal forward path that samples a signal output by the input signal forward path to produce an attenuated output signal, determines an outer loop error based on the attenuated output signal, and produces an outer loop control signal based on the outer loop error, and wherein the input signal forward path adjusts at least one of a gain and a phase of a signal coupled to the input signal forward path based on the outer loop control signal.

2. The apparatus of claim 1, wherein the input Fourier Transform Matrix (FTM) is a digital FTM and the output FTM is a radio frequency FTM.

3. The apparatus of claim 1, wherein the outer loop feedback circuit compares at least a portion of the attenuated output signal to an outer loop desired signal to produce a comparison, and produces the outer loop control signal based on the comparison.

4. The apparatus of claim 3, wherein the attenuated output signal is based on an outer loop test signal received by the input FTM at an input port of the input FTM.

5. The apparatus of claim 1, wherein the input signal forward path receives an input signal and further receives an outer loop test signal, wherein the attenuated output signal comprises an input signal portion and an outer loop test signal portion, and wherein the outer loop feedback circuit separates the input signal portion of the attenuated output signal from the outer loop test signal portion of the attenuated output signal and produces the outer loop control signal based on the outer loop test signal portion of the output FTM output signal.

6. The apparatus of claim 1, wherein, in response to a coupling of an outer loop test signal to the input signal forward path, an output port of the plurality of output FTM output ports produces an output FTM output signal, and wherein the outer loop feedback circuit comprises:
    a plurality of outer loop signal couplers, wherein an outer loop signal coupler of the plurality of outer loop signal couplers samples the output FTM output signal to produce an attenuated output signal; and a controller that compares at least a portion of the attenuated output signal to an outer loop desired signal to produce the outer loop control signal.

7. The apparatus of claim 1, further comprising an inner loop feedback circuit coupled to the signal processing section that determines an inner loop error in the signal processing section and produces an inner loop control signal based on the inner loop error, wherein signal processing section adjusts at least one of a gain and a phase of a signal coupled to the signal processing section based on the inner loop control signal.

8. The apparatus of claim 7, wherein the signal processing section produces a signal processing section output signal and wherein the inner loop feedback circuit samples the signal processing section output signal to produce an attenuated signal processing section output signal, compares at least a portion of the attenuated signal processing section output signal to a inner loop desired signal to produce a comparison, and produces the inner loop control signal based on the comparison.

9. The apparatus of claim 8, wherein the signal processing section output signal is based on an inner loop test signal received by the signal processing section.

10. The apparatus of claim 9, wherein the input signal forward path receives an input signal and the signal processing section receives an inner loop test signal, wherein the signal processing section produces an signal processing section output signal that comprises an input signal portion and an inner loop test signal portion, and wherein the inner loop feedback circuit separates the input signal portion of the signal processing section output signal from the inner loop test signal portion of the signal processing section output signal and produces the inner loop control signal based on the inner loop test signal portion of the signal processing section output signal.

11. The apparatus of claim 7, wherein the signal processing section produces a plurality of signal processing section output signals and wherein the inner loop feedback circuit comprises:

a plurality of inner loop signal couplers, wherein each inner loop signal coupler of the plurality of inner loop signal couplers is coupled to an output port of the plurality of signal processing section output ports and wherein each inner loop signal coupler samples an output signal produced at a respective output port of the signal processing section to produce an attenuated signal processing section output signal; and a controller that compares at least a portion of the attenuated signal processing section output signal to an inner loop desired signal to produce the inner loop control signal.

12. A multi-channel transmitter comprising:

an input signal forward path having a plurality of input ports and a plurality of output ports, the input signal forward path further comprising:

an input fourier transform matrix (FTM) having a plurality of input ports and a plurality of output ports that receives a predetermined signal at an input port of the plurality of input ports and routes at least a portion of the predetermined signal to each output port of the plurality of output ports to produce a plurality of input FTM output signals;

a signal processing section having plurality of input ports and a plurality of output ports, wherein each input port of the plurality of input ports of the signal processing section receives an input FTM output signal of the plurality of input FTM output signals and wherein the signal processing section amplifies each received input FTM output signal to produce an amplified signal and routes each amplified signal to an output port of the plurality of signal processing section output ports;

an output FTM having a plurality of input ports and a plurality of output ports, wherein each input port of the plurality of input ports of the output FTM receives an amplified signal from an output port of the plurality of output ports of the signal processing section, and wherein the output FTM produces a forward path output signal at an output port of the plurality of output ports based on the plurality of received amplified signals; and an outer loop feedback circuit coupled to the input signal forward path that receives at least a portion of the forward path output signal, determines an outer loop error based on the at least a portion of the forward path output signal, produces an outer loop control signal based on the determined outer loop error, and wherein the input signal forward path adjusts at least one of a gain and a phase of a signal coupled to the input signal forward path based on the outer loop control signal.

13. The transmitter of claim 12, wherein the input Fourier Transform Matrix (FTM) is a digital FTM and the output FTM is a radio frequency FTM.

14. The transmitter of claim 12, further comprising an inner loop feedback circuit coupled to the signal processing section that determines an inner loop error in the signal processing section and produces an inner loop control signal based on the inner loop error, and wherein the signal processing section adjusts at least one of a gain and a phase of a signal input into the signal processing section based on the inner loop control signal.

15. The transmitter of claim 14, wherein the signal processing section receives an inner loop test signal, amplifies the inner loop test signal to produce an inner loop output signal, and conveys at least a portion of the inner loop output signal the inner loop feedback circuit, and wherein the inner loop feedback circuit produces an inner loop control signal based on the at least a portion of the inner loop output signal.

16. A method of error compensation in a hybrid matrix amplification system comprising steps of:

coupling a predetermined signal to a first Fourier Transform Matrix (FTM) to produce a plurality of first FTM output signals;

processing each first FTM output signal of the plurality of first FTM output signals to produce a plurality of amplified signals;

coupling each amplified signal of the plurality of amplified signals to an input port of a plurality of input ports of a second FTM, wherein the second FTM produces a second FTM output signal based on the plurality of amplified signals;

determining a loop error based on the second FTM output signal; and producing a control signal based on the determined loop error, wherein the control signal is operable to adjust at least one of a gain and a phase of a signal coupled to the hybrid matrix amplification system.

17. The method of claim 16, wherein the step of determining a loop error comprises steps of:

sampling the second FTM output signal to produce a sampled output signal; and determining a loop error based on the sampled output signal.

18. The method of claim 17, wherein the step of determining a loop error comprises a step of comparing at least a portion of the sampled output signal to a desired signal to produce a loop error.

19. The method of claim 18, further comprising a step of coupling an information, signal to the first Fourier Transform Matrix (FTM) such that each first FTM output signal of the plurality of first FTM output signals comprises an information signal portion and a predetermined signal portion, wherein the sampled output signal comprises an information signal portion and a predetermined signal portion, and wherein the step of determining a loop error comprises steps of separating the information signal portion of the sampled output signal from the predetermined signal portion of the sampled output signal and determining a loop error based on the predetermined signal portion of the sampled output signal.

20. The method of claim 16, wherein the predetermined signal is a baseband signal and wherein the step of processing each first Fourier Transform Matrix (FTM) output signal of the plurality of FTM output signals comprises a step of modulating and amplifying each FTM output signal of the plurality of FTM output signals to produce a plurality of amplified radio frequency (RF) signals.

21. The method of claim 16, wherein the hybrid matrix amplification system comprises a signal processing section coupled between the first Fourier Transform Matrix (FTM) and the second FTM, wherein the predetermined signal comprises a first predetermined signal, wherein the loop error comprises a first loop error, wherein the control signal comprises a first control signal, and wherein the method further comprises steps of:

coupling a second predetermined signal to the signal processing section to produce a signal processing section output signal;

determining a second loop error based on the signal processing section output signal; and producing a second control signal based on the determined second loop error, wherein the second control signal is operable to adjust at least one of a gain and a phase of a signal coupled to the signal processing section.

* * * * *

UNITED STATES PATENT AND TRADEMARK OFFICE
CERTIFICATE OF CORRECTION

PATENT NO. : 6,661,284 B1
DATED : December 9, 2003
INVENTOR(S) : Luz et al.

It is certified that error appears in the above-identified patent and that said Letters Patent is hereby corrected as shown below:

<u>Column 28,</u>
Line 8, after "information", please delete ",".

Signed and Sealed this

Second Day of March, 2004

JON W. DUDAS
*Acting Director of the United States Patent and Trademark Office*